(12) United States Patent
Park et al.

(10) Patent No.: US 11,513,385 B2
(45) Date of Patent: Nov. 29, 2022

(54) COLOR CONVERSION ELEMENT AND DISPLAY DEVICE INCLUDING THE SAME

(71) Applicant: Samsung Display Co., Ltd., Yongin-si (KR)

(72) Inventors: Kyoung Won Park, Seoul (KR); Min Ki Nam, Incheon (KR); Sung Woon Kim, Yongin-si (KR); Dong Han Song, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 273 days.

(21) Appl. No.: 16/413,539

(22) Filed: May 15, 2019

(65) Prior Publication Data

US 2020/0081292 A1 Mar. 12, 2020

(30) Foreign Application Priority Data

Sep. 11, 2018 (KR) ........................ 10-2018-0108166

(51) Int. Cl.
*G02F 1/1335* (2006.01)
*H01L 27/32* (2006.01)

(52) U.S. Cl.
CPC .. *G02F 1/133514* (2013.01); *G02F 1/133512* (2013.01); *H01L 27/322* (2013.01)

(58) Field of Classification Search
CPC ......... G02F 1/133514; G02F 1/133614; G02F 1/133617; G02F 1/133621; H01L 27/322;
(Continued)

(56) References Cited

U.S. PATENT DOCUMENTS 9,828,395 B2 11/2017 Koh et al.
10,114,247 B2 10/2018 Lee
(Continued)

FOREIGN PATENT DOCUMENTS

CN 106405918 A 2/2017
CN 107017325 A 8/2017
(Continued)

OTHER PUBLICATIONS

English language translation of PCT Patent Application Publication No. WO2014129067, translated from Japanese; publication date Aug. 28, 2014; downloaded from Espacenet at http://worldwide.espacenet.com on Oct. 16, 2021; English language translation provided by Google Translate tool onsite. (Year: 2014).*

(Continued)

*Primary Examiner* — Angela K Davison
(74) *Attorney, Agent, or Firm* — Lewis Roca Rothgerber Christie LLP

(57) ABSTRACT

A color conversion element and a display device including the same are provided. The color conversion element includes: a base substrate in which a first region and a second region are defined; a color conversion layer on the base substrate, in the first region, and including color conversion particles configured to convert a wavelength of incident light; and a color light transmitting layer on the base substrate and in the second region; wherein each of the color conversion particles includes a compound represented by Formula 1 ($AmBnXl - - - (1)$), where, in Formula 1, A is Cs, Rb, or an alloy thereof; B is at least one of Cu, Sb, Ge, Sn, and Bi, or an alloy thereof; m, n, and l are each an integer of 1 to 9; and X is at least one of F, Cl, Br, and I, or a mixture thereof.

26 Claims, 17 Drawing Sheets

(58) Field of Classification Search
CPC ..... H01L 33/50; H01L 33/502; H01L 33/504; F21K 9/64; F21V 9/30; F21V 9/38
See application file for complete search history.

(56) References Cited

U.S. PATENT DOCUMENTS

| | | | |
|---|---|---|---|
| 10,329,484 B2 | 6/2019 | Kovalenko et al. | |
| 10,436,973 B2 | 10/2019 | Wang et al. | |
| 10,816,716 B2 | 10/2020 | Wang et al. | |
| 2014/0368766 A1* | 12/2014 | Shibata | G02F 1/133553 349/61 |
| 2015/0364523 A1* | 12/2015 | Sato | H01L 51/5203 257/13 |
| 2017/0031205 A1 | 2/2017 | Lee | |
| 2017/0155020 A1 | 6/2017 | Lin et al. | |
| 2017/0186922 A1 | 6/2017 | Kim et al. | |
| 2017/0369776 A1 | 12/2017 | Luchinger et al. | |
| 2018/0083074 A1* | 3/2018 | Yamazaki | H01L 27/3267 |
| 2019/0018287 A1* | 1/2019 | Luchinger | H01L 33/502 |

FOREIGN PATENT DOCUMENTS

| | | |
|---|---|---|
| EP | 3192846 A2 | 7/2017 |
| EP | 3339394 A1 | 6/2018 |
| KR | 10-2017-0078553 A | 7/2017 |
| KR | 10-2017-0105880 A | 9/2017 |
| KR | 10-2018-0021612 A | 3/2018 |
| WO | 2017/108962 A1 | 6/2017 |

OTHER PUBLICATIONS

EPO Extended Search Report dated Oct. 31, 2019, corresponding to European Patent Application No. 19179163.1 (7 pages).
Swarnkar, Abhishek et al.; "Beyond Colloidal Cesium Lead Halide Perovskite Nanocrystals: Analogous Metal Halides and Doping"; ACS Energy Letters; 2017; 2; pp. 1089-1098.

* cited by examiner

COLOR CONVERSION ELEMENT AND DISPLAY DEVICE INCLUDING THE SAME

This application claims priority to and the benefit of Korean Patent Application No. 10-2018-0108166, filed on Sep. 11, 2018, in the Korean Intellectual Property Office, the entire content of which is incorporated herein by reference.

BACKGROUND

1. Field

Embodiments of the present disclosure relate to a color conversion element and a display device including the same.

2. Description of the Related Art

The importance of display devices has increased with the development of multimedia. Accordingly, various types or kinds of display devices such as a liquid crystal display (LCD) and an organic light emitting display (OLED) have been used. A display device may include a color conversion element. The color conversion element may be on a display device in the form of a separate substrate or may be integrated directly with elements in the display device.

As an example, the color conversion element may receive blue light from a light source and emit blue light, green light, and red light, respectively, thereby allowing an image having various colors to be viewed. In this case, a region expressing a blue color in the color conversion element may be configured to emit the blue light provided by the light source as it is.

SUMMARY

Aspects of embodiments of the present disclosure are to provide a color conversion element in which luminance for light and light conversion efficiency are improved by using a color conversion layer including a perovskite compound.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description of the present disclosure set forth below.

According to an exemplary embodiment of the present disclosure, a color conversion element includes: a base substrate in which a first region and a second region are defined; a color conversion layer on the base substrate, in the first region, and including color conversion particles configured to convert a wavelength of incident light; and a color light transmitting layer on the base substrate and in the second region; wherein each of the color conversion particles includes a compound represented by Formula 1:

$$A_m B_n X_l \qquad (1)$$

in Formula 1, A is Cs, Rb, or an alloy thereof; B is at least one of Cu, Sb, Ge, Sn, and Bi, or an alloy thereof; m, n, and l are each an integer of 1 to 9; and X is at least one of F, Cl, Br, and I, or a mixture thereof.

In an exemplary embodiment, wherein each of the color conversion particles has a polygonal or linear structure.

In an exemplary embodiment, a length of the color conversion particle measured in one direction may be longer than a length of the color conversion particle measured in a direction perpendicular (e.g., substantially perpendicular) to the one direction, and the length of the color conversion particle measured in the direction perpendicular (e.g., substantially perpendicular) to the one direction may be greater than a thickness of the color conversion particle.

In an exemplary embodiment, the length of the color conversion particle measured in the one direction may be in a range of 2 nm to 300 nm, and the thickness of the color conversion particle may be in a range of 0.5 nm to 5 nm.

In an exemplary embodiment, the color conversion element further includes: a color filter layer which is between the color conversion layer and the base substrate, on which light emitted from the color conversion layer is incident, and which is configured to block a part of the light.

In an exemplary embodiment, the color conversion layer may include a light transmitting resin configured not to absorb the incident light.

In an exemplary embodiment, the color conversion particles may be dispersed in the light transmitting resin in a state where at least one particle may be aggregated with another particle adjacent thereto.

In an exemplary embodiment, the color conversion layer may include first color conversion particles on which first light having a center wavelength band of a first wavelength is to be incident and which convert the first light into second light having a center wavelength band of a second wavelength longer than the first wavelength.

In an exemplary embodiment, the color filter layer may include a first color filter layer between the first color conversion layer and the base substrate, and the first color filter layer may be configured to transmit the second light and to block the first light.

In an exemplary embodiment, the color conversion layer may include first color conversion particles configured to convert the first light into third light having a center wavelength band of a third wavelength longer than the second wavelength, and the color filter layer may further include a second color filter layer between the second conversion layer and the base substrate.

In an exemplary embodiment, the first color conversion particle and the second conversion particle may include the Xs different from each other in Formula 1.

In an exemplary embodiment, the second color filter layer may be configured to transmit the third light and to block the first light and the second light.

In an exemplary embodiment, the second color conversion layer may further include a quantum dot material.

In an exemplary embodiment, the first light may be incident on the color light transmitting layer, the color filter layer may further include a third color filter layer between the color light transmitting layer and the base substrate, the color light transmitting layer may be configured to emit the first light to the third color filter layer, and the third color filter layer may be configured to transmit the first light and to block the second light and the third light.

In an exemplary embodiment, the color conversion element may further include: a low refractive layer between the color conversion layer and the color filter layer having a lower refractive index than the light transmitting resin of the color conversion layer, wherein the low refractive layer is configured to reflect at least a part of the light emitted from the color conversion layer and incident on the color filter layer.

In an exemplary embodiment, the color conversion element may further include: an optical filter layer on a surface other than an outer surface of the color conversion layer, contacting the base substrate, and configured to reflect light emitted from the color conversion layer.

In an exemplary embodiment, the optical filter layer may be configured to transmit at least a part of light incident on the color conversion layer or emitted from the color conversion layer, and to reflect other parts of the light.

According to an exemplary embodiment of the present application, a display device includes: a display element; and a color conversion element on the display element, wherein the color conversion element includes: a base substrate in which a first region and a second region are defined; a color conversion layer on the base substrate, in the first region, and including color conversion particles configured to convert a wavelength of incident light; and a color light transmitting layer on the base substrate and in the second region; wherein each of the color conversion particles includes a compound represented by Formula 1:

in Formula 1, A is Cs, Rb, or an alloy thereof; B is at least one of Cu, Sb, Ge, Sn, and Bi, or an alloy thereof; m, n, and l are each an integer of 1 to 9; and X is at least one of F, Cl, Br, and I, or a mixture thereof.

In an exemplary embodiment, each of the color conversion particles may have a polygonal or linear structure.

In an exemplary embodiment, a length of the color conversion particle measured in one direction may be longer than a length of the color conversion particle measured in a direction perpendicular (e.g., substantially perpendicular) to the one direction, and the length of the color conversion particle measured in the direction perpendicular (e.g., substantially perpendicular) to the one direction may be greater than a thickness of the color conversion particle.

In an exemplary embodiment, the length of the color conversion particle measured in the one direction may be in a range of 2 nm to 300 nm, and the thickness of the color conversion particle may be in a range of 0.5 nm to 5 nm.

In an exemplary embodiment, a color filter layer which may be between the color conversion layer and the base substrate, on which light emitted from the color conversion layer is incident, and which is configured to block a part of the light.

In an exemplary embodiment, the color conversion layer may include a light transmitting resin configured not to absorb the incident light.

In an exemplary embodiment, the color conversion particles may be dispersed in the light transmitting resin in a state where at least one particle may be aggregated with another particle adjacent thereto.

In an exemplary embodiment, the color conversion layer may include: a first color conversion layer including first color conversion particles on which first light having a center wavelength band of a first wavelength is incident and which convert the first light into second light having a center wavelength band of a second wavelength longer than the first wavelength; and a second color conversion layer including second color conversion particles configured to convert the first light into third light having a center wavelength band of a third wavelength longer than the second wavelength.

In an exemplary embodiment, the first color conversion particle and the second conversion particle may include the Xs different from each other in Formula 1.

In an exemplary embodiment, the display element may include: a first substrate; a second substrate facing the first substrate; a liquid crystal layer between the first substrate and the second substrate; and a light source opposite to the light conversion element with respect to the liquid crystal layer.

In an exemplary embodiment, the display element may include: a first electrode; a hole transporting layer on the first electrode; a light emitting layer on the hole transporting layer; and a second electrode on the light emitting layer.

BRIEF DESCRIPTION OF THE DRAWINGS

The above and other aspects and features of embodiments of the present disclosure will become more apparent by describing in more detail exemplary embodiments thereof with reference to the accompanying drawings, in which.

DETAILED DESCRIPTION

The present disclosure will now be described more fully hereinafter with reference to the accompanying drawings, in which example embodiments of the disclosure are shown. The subject matter of this disclosure may, however, be embodied in different forms and should not be construed as limited to the embodiments set forth herein. Rather, these embodiments are provided so that this disclosure will be thorough and complete, and will filly convey the scope of the subject matter of the present disclosure to those skilled in the art.

It will also be understood that when a layer is referred to as being "on" another layer or substrate, it can be directly on the other layer or substrate, or intervening layers may also be present. In addition, it will also be understood that when an element or layer is referred to as being "between" two elements or layers, it can be the only element or layer between the two elements or layers, or one or more intervening elements or layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Hereinafter, embodiments of the present disclosure will be described with reference to the accompanying drawings.

Figure 1:
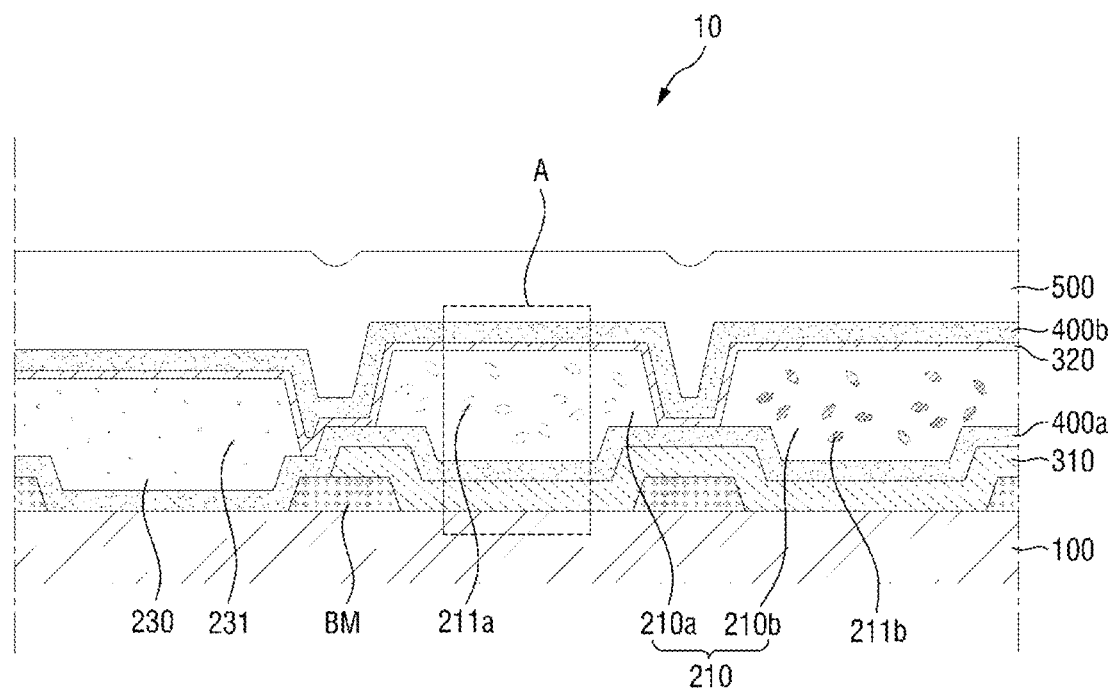
FIG. 1 is a cross-sectional view of a color conversion element according to an embodiment.
Figure 2:
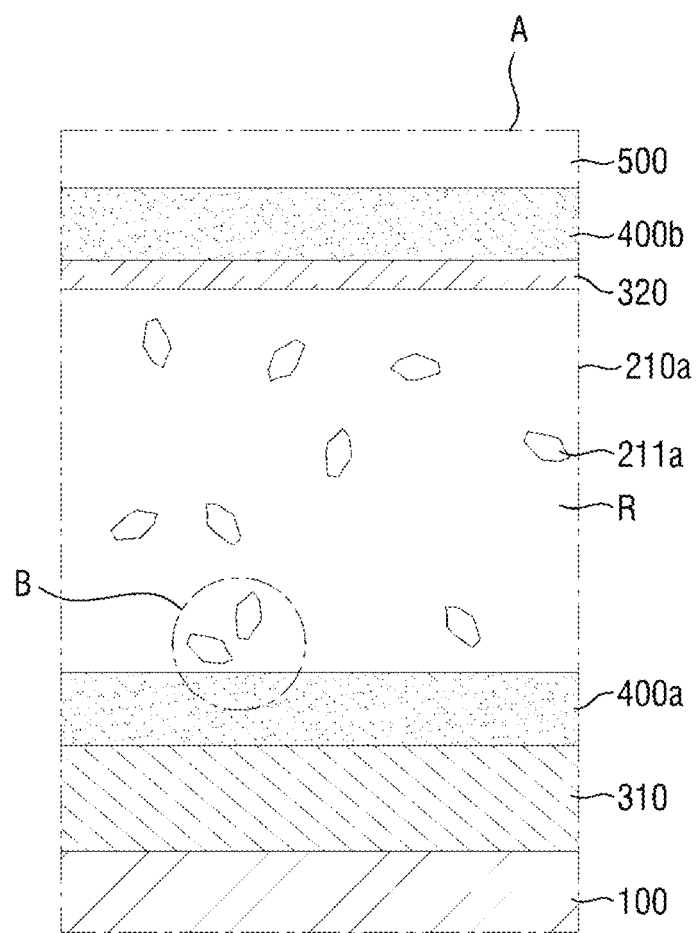
FIG. 2 is an enlarged view of the portion A in FIG. 1.

FIG. 1 is a cross-sectional view of a color conversion element according to an embodiment, and FIG. 2 is an enlarged view of the portion A in FIG. 1.

Referring to FIGS. 1-2, a color conversion element 10 according to an embodiment includes a base substrate 100, a color conversion layer 210, a color light transmitting layer 230, a color filter layer 310, an optical filter layer 320, a light blocking member BM, and an overcoat layer 500.

The base substrate 100 may support the components of the color conversion element 10 by providing a space in which the color conversion layer 210, the color light transmitting layer 230, the light blocking member BM, and the like may be located. The base substrate 100 may be a light transmitting substrate. In an exemplary embodiment, when the color conversion element 10 is coupled to a display element, the color conversion element 10 may be coupled to the display element shown in FIG. 1 such that the upper portion of the color conversion element face the display device (refer to FIGS. 14-15). In this case, the light provided from the display element may be transmitted from the upper surface of the base substrate 100 to the lower surface thereof, based on FIG. 1.

The light blocking member BM is on the base substrate 100. A region overlapping a portion where the light blocking member BM is located may be a light blocking region in which the transmission of visible light is substantially blocked, and a region overlapping a portion where the light blocking member BM is not located may be a light transmitting region.

The light blocking member BM may be in a set or predetermined pattern. For example, the light blocking member BM may have a pattern of a type (or kind) between adjacent layers of the conversion layer 210 and the color light transmitting layer 230 (e.g., the light blocking member BM may be located to be between adjacent layers of the conversion layer 210 and the color light transmitting layer 230). The light blocking member BM may prevent the color mixing occurring between the adjacent conversion layer 210 and color light transmitting layer 230 to improve color reproducibility and the like.

The light blocking member BM may include a material having a high absorption rate for visible light. In an exemplary embodiment, the light blocking member BM may include a metal such as chromium, a metal nitride, a metal oxide, or a resin material colored in black, but the present disclosure is not limited thereto.

The color conversion layer 210 and the color light transmitting layer 230 may be in a region where the light blocking member BM on the base substrate 100 is not located. However, the present disclosure is not limited thereto, and a part of the color conversion layer 210 and/or the color light transmitting layer 230 may be on the light blocking member BM to overlap at least a part of the light blocking member BM. Further, the base substrate 100 may be defined as a first region and a second region. The color conversion layer 210 and the color light transmitting layer 230 may be over the base substrate 100, and may be in the first region and the second region, respectively. The layers of the color conversion layer 210 and the color light transmitting layer 230 may be spaced apart from each other by a set or predetermined distance, but the present disclosure is not limited thereto.

The color conversion layer 210 may include a first color conversion layer 210a and a second color conversion layer 210b. The first color conversion layer 210a, the second color conversion layer 210b, and the color light transmitting layer 230 may be arranged on the base substrate 100 in a set or predetermined order or rule. For example, the first color conversion layer 210a, the second color conversion layer 210b, and the color light transmitting layer 230 may be arranged in a set or specific pattern on a plane. As used herein, although it is shown in the drawings that the first color conversion layer 210a, the second color conversion layer 210b, and the color light transmitting layer 230 are arranged in this order, the arrangement order or arrangement rule of the respective layers is not limited thereto.

Hereinafter, a case where the color conversion layer 210 is the first color conversion layer 210a and the second color conversion layer 210b will be described as an example.

The color light transmitting layer 230 may receive first light L1 having a first wavelength, and emit the first light L1 as it is. For example, the color light transmitting layer 230 may be a layer that is configured to transmit the first light L1 provided from a light source.

In an exemplary embodiment, the first light L1 may be blue light having a center wavelength band of about 450 nm to 495 nm. However, it should be understood that the blue wavelength band is not limited to the above example, and includes all of the wavelength ranges that can be recognized as blue in the art.

The color light transmitting layer 230 may be formed of a transparent organic film to transmit the light provided from the light source as it is. In some embodiments, the color light transmitting layer 230 may include a colorant having the same (e.g., substantially the same) color as the first light L1. For example, the colorant may be a pigment, a dye, or a mixture thereof, and the colorant may be dispersed in a transparent organic film constituting the color light transmitting layer 230. The color light transmitting layer 230 includes a colorant having the same (e.g., substantially the same) color as the first light L1, thereby increasing the color purity of the first light L1 emitted from the color light transmitting layer. However, the present disclosure is not limited thereto, and the color light transmitting layer 230 may be formed of an organic film having a color that is configured to transmit only the wavelength band of the first light L1.

The color light transmitting layer 230 may further include scatterers 231. The scatterers 231 may be dispersed in the color light transmitting layer 230. The scatterers 231 may scatter the light incident on the color light transmitting layer 230 to uniformize the front and side luminance of the light emitted from the color light transmitting layer 230, and thus the viewing angle of the display device including the color conversion element 10 can be improved. The scatterers may be any suitable material capable of uniformly (e.g., substantially uniformly) scattering light. For example, the material of the scatterers may be nanoparticles of $SiO_2$, $TiO_2$, $ZrO_2$, $Al_2O_3$, $In_2O_3$, $ZnO$, $SnO_2$, $Sb_2O_3$, and ITO.

The first color conversion layer 210a may receive the first light L1 and emit second light L2 having a second wavelength having a center wavelength band longer than that of the first wavelength. For example, the first color conversion layer 210a may be a layer that converts the first light L1 provided from the light source into the second light L2.

In an exemplary embodiment, the second light L2 may be green light having a center wavelength band of about 495 nm to about 570 nm. However, it should be understood that the green wavelength band is not limited to the above example, and includes all of the wavelength ranges that can be recognized as green in the art.

The second color conversion layer 210b may receive the first light L1 and emit third light L3 having a third wavelength having a center wavelength band longer than that of the second wavelength. For example, the second color conversion layer 210b may be a layer that converts the first light L1 provided from the light source into the third light L3.

In an exemplary embodiment, the third light L3 may be red light having a center wavelength band of about 620 nm to about 750 nm. However, it should be understood that the red wavelength band is not limited to the above example, and includes all of the wavelength ranges that can be recognized as red in the art.

At least one of the color conversion layers 210 may include color conversion particles 211 that convert any incident light L incident on the color conversion layer 210 into any emitted light L' having a center wavelength band different from the center wavelength band of the incident light L. In an exemplary embodiment, the first color conversion layer 210a may include first color conversion particles 211a that convert the first light L1 provided from the light source into the second light L2, and the second color conversion layer 210b may include second color conversion particles 211b that convert the first light L1 provided from the light source into the third light L3.

Meanwhile, the color conversion particles 211 may include a perovskite compound. The perovskite compound may be organic/inorganic hybrid perovskite, inorganic metal halide perovskite, or the like depending on the composition of the perovskite compound.

The perovskite compound may have any crystal structure suitable or possible for a perovskite compound. The crystal structure may be cubic, tetragonal, rhombohedral, orthorhombic or hexagonal structure, but is not limited thereto.

The perovskite compound does not have a fixed crystal structure with respect to the same composition. The perovskite compound may have various suitable structures where arbitrary atoms are fluidly arranged in the unit cell (Cell). For example, the perovskite compound may have a crystal structure, a particle structure, or a quantum dot structure, and may also have a sheet structure in which arbitrary particles are fluidly arranged in the unit cell. In some embodiments, the crystal structure of the perovskite compound is not limited by the composition ratio of the perovskite compound, and the perovskite compound may have a composition ratio within a set or predetermined range in the unit cell with an arbitrary structure. Accordingly, as will be described later, the shape of the color conversion particles 211 including the perovskite compound may be changed.

The perovskite compound may convert the light incident on the color conversion layer 210 into light having a different wavelength band. The perovskite compound is configured to absorb the incident light, so that the electrons in a valence band are shifted to the energy level of a conduction band to be excited. Thereafter, the electrons in the conduction band are shifted to the energy level of the valence band to emit light of a wavelength having a value corresponding to a band gap. Through this process, the color conversion particles 211 may convert the wavelength of the incident light and emit the converted light as light (emitted light) of another wavelength band.

In the case of converting the wavelength of incident light using comparative Indium-P (InP) quantum dots (QD), it was necessary to control the particle size of the InP quantum dots. In the case of the InP quantum dots, the wavelength of the emitted light varies depending on the particle size, so that it is possible to emit light having a desired wavelength band by controlling the particle size. In order to increase the color purity of emitted light, the particle size of the InP quantum dot needs to have relatively high uniformity, and in order to emit light having the corresponding wavelength band, it is necessary to accurately control the particle size of the quantum dot. Further, there is a problem in that luminance and light conversion efficiency are low when emitting green light having a wavelength band of 495 nm to 570 nm.

In some embodiments, in the case of the perovskite compound, the wavelength band of the light emitted through the above-described process is influenced by the composition of the compound. For example, even when the particle sizes of a perovskite compound having a set or specific composition are not comparatively uniform, this perovskite compound may emit light of the corresponding wavelength band with high color purity. Further, when emitting green light having a wavelength band of 495 nm to 570 nm, there is a feature of high luminance and high light conversion efficiency as compared with InP quantum dots.

The color conversion particle 211 according to the present disclosure may include a compound represented by Formula 1 below.

$$A_m B_n X_l \qquad \text{Formula 1}$$

(In Formula 1, A is Cs, Rb, or an alloy thereof; B is at least one of Cu, Sb, Ge, Sn, and Bi, or an alloy thereof; m, n, and l are each an integer of 1 to 9; and X is at least one of F, Cl, Br, and I, or a mixture thereof.)

The color conversion particle 211 may include cesium (Cs) or rubidium (Rb), and may include a perovskite compound having a composition ratio within a set or specific range per unit cell. According to the light conversion characteristics of the aforementioned color conversion particle 211, the perovskite compound may have a composition ratio suitable for converting incident light into light of a set or specific wavelength band.

In Formula 1, B may be at least one of antimony (Sb), arsenic (Bi), tin (Sn), germanium (Ge), and copper (Cu). According to an embodiment, the color conversion particles 211 may be realized as safe color conversion particles having no toxicity using a perovskite compound including no lead (a Pb-free perovskite compound). Since an element such as cadmium (Cd) or lead (Pb) is harmful to the human body, the use thereof may be restricted through environmental regulations. The color conversion layer 210 does not include the aforementioned toxic element, thereby realizing an environmentally safe color conversion element 10.

X, which is a halogen element, may be fluorine (F), chlorine (Cl), bromine (Br) or iodine (I), or may be a combination thereof. In the color conversion particle including the compound represented by Formula 1, the wavelength band of the converted light may be varied depending on the composition ratio of the elements and the kind of the halogen element represented by X. In order to adjust the wavelength band or color of the light emitted from the color conversion particles 211, the kind of the halogen element included in the compound of Formula 1 may be selectively changed.

In an exemplary embodiment, if A is Cs, B is Sb, X is Br, and each of m, n, and l has a value within the above range, the compound of Formula 1 may be represented by $Cs_3Sb_2Br_9$. In this case, the color conversion particles 211 may convert the incident first light L1 of a blue color into the second light L2 of a green color. As another example, if A is Cs, B is Sb, X is I, and each of m, n, and l has a value within the above range, the compound of Formula 1 may be represented by $Cs_3Sb_2I_9$. In this case, the color conversion particles 211 may convert the incident first light L1 of a blue color into the second light L3 of a red color.

According to an embodiment, the first color conversion particles 211a and the second color conversion particles 211b include Xs different from each other, so that the incident first light L1 is converted into the second light L2 and the third light L3. Accordingly, the first color conversion layer 210a and the second color conversion layer 210b may emit light of different colors even if light of the same (e.g., substantially the same) color is incident thereon.

Figure 3:
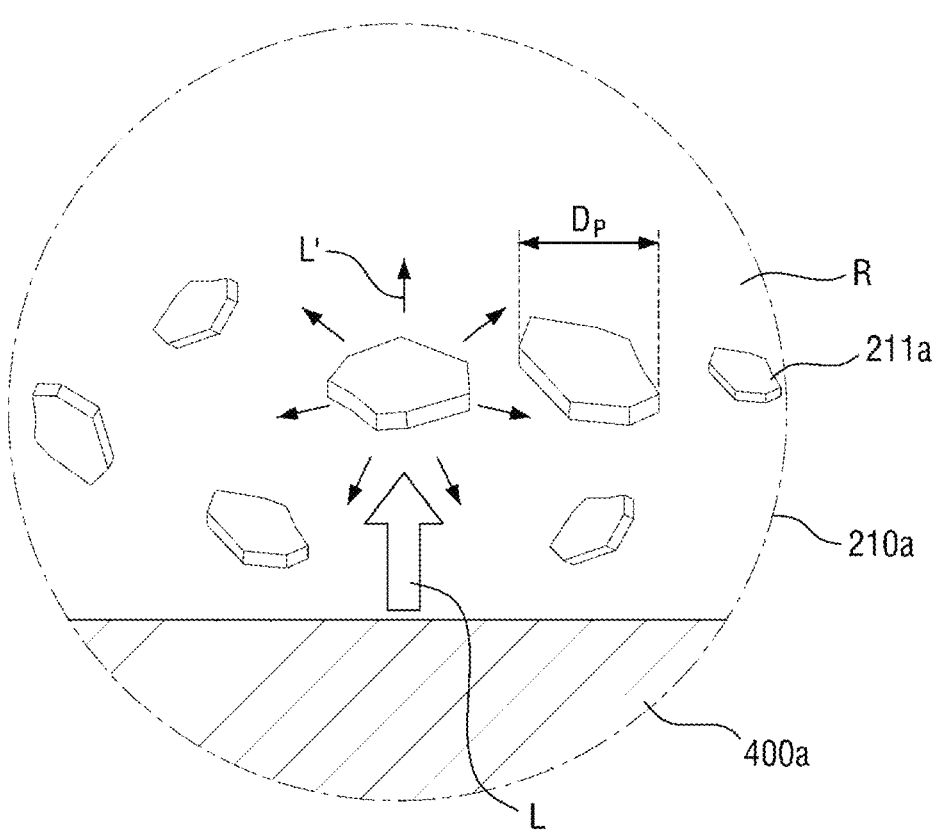
FIG. 3 is an enlarged view of the portion B in FIG. 2.

FIG. 3 is an enlarged view of the portion B in FIG. 2. In an embodiment, the color conversion particle 211 including the perovskite compound may have a particle size (Dp) of nanometer units and may have a polygonal or linear structure. It is shown in FIG. 3 that the color conversion particles 211 are sheet-like or plate-like color conversion particles each having one surface of a polygonal structure and having a set or predetermined thickness. However, the present disclosure is not limited thereto, and the color conversion particles 211 may be wire-like or spherical color conversion particles.

In an exemplary embodiment, each the color conversion particles 211 may have a particle size of 2 nm to 300 nm, 5 nm to 200 nm, 10 nm to 100 nm, or 20 nm to 50 nm.

As an example, each the color conversion particles 211 may be configured such that the length measured in one direction is longer than the length measured in a direction perpendicular (e.g., substantially perpendicular) to the one direction, and the length measured in the direction perpendicular (e.g., substantially perpendicular) to the one direction is longer than the thickness of each of the color conversion particle 211. In this case, each of the color conversion particles 211 may be configured such that the length measured in one direction is in a range of 2 nm to 300 nm, and the thickness thereof is in a range of 0.5 nm to 5 nm. However, the present disclosure is not limited thereto.

A comparative InP quantum dot has a core-shell structure, and may thus be formed by different kinds of materials included in the core and the shell. Further, the comparative InP quantum dot may have a concentration gradient in which the concentration of an element decreases from the shell toward an interface between the core and the shell. In contrast, the perovskite compound may have a structure consisting of a single element, not the core-shell structure. Thus, the concentration between the outer interface and inner center of the quantum dot particle may be uniform (e.g., substantially uniform) without a concentration gradient. However, the present disclosure is not limited thereto.

The color conversion particles 211 may be dispersed in a light transmitting resin R. The light transmitting resin R is not particularly limited as long as it does not absorb (or does not substantially absorb) light incident on the color conversion layer 210 and does not affect (or does not substantially affect) the light absorption and emission of the color conversion particles 211. For example, the light transmitting resin R may include any suitable resin available in the art that is configured to transmit a suitable amount of light and allows for suitable light absorption and emission by the color conversion particles.

When incident light L having a set or specific wavelength band is incident on the color conversion particles 211, electrons in the valence band is excited to the energy level of the conduction band and is shifted to the valence band again, thereby emitting light L' having a converted wavelength band.

In an exemplary embodiment, when the first light L1 having a center wavelength band in a range of 450 nm to 495 nm is incident on the color conversion particles 211 including the compound represented by Formula 1, these color conversion particles 211 may convert the first light L1 into second light L2 having a center wavelength band in a range of 495 nm to 570 nm or third light L3 having a center wavelength band in a range of 620 nm to 750 nm. For example, when blue light is incident on the color conversion particles 211, the color conversion particles may convert the blue light into green or red light.

Figure 4:
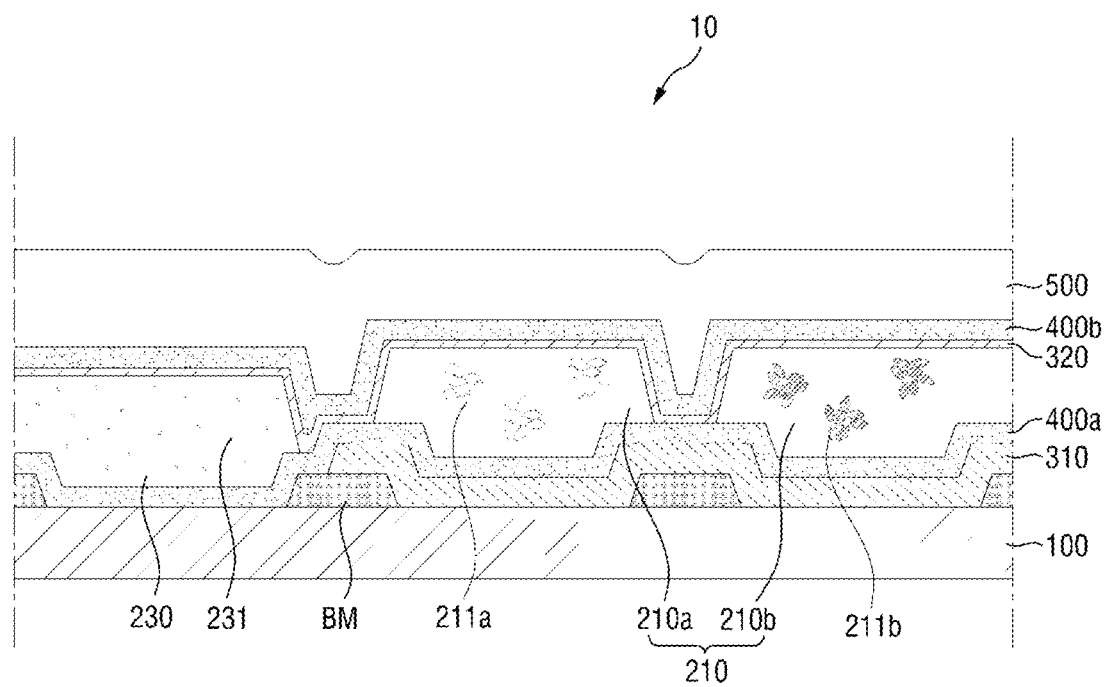
FIG. 4 is a cross-sectional view of a color conversion element in which color conversion particles are dispersed in a color conversion layer according to another embodiment.

Meanwhile, FIG. 4 is a cross-sectional view of a color conversion element in which color conversion particles 211 are dispersed in a color conversion layer 210 according to another embodiment.

The color conversion particles 211 according to an embodiment may be dispersed in the light transmitting resin R by aggregating at least one particle with at least another adjacent particle.

Referring to FIG. 4, unlike FIG. 3, the plurality of color conversion particles 211 may be dispersed in the light transmitting resin R in a clustered state. In this case, the color conversion particles 211 may be formed into one single nanocrystal by combining a plurality of unit cells. However, the present disclosure is not limited thereto.

Meanwhile, the color conversion layer 210 including the color conversion particles 211 may be formed using various suitable processes such as ink jet injection, but the present disclosure is not limited thereto.

The first color conversion layer 210a and the second color conversion layer 210b may each include the color conversion particles 211 including the aforementioned perovskite compound, and any one of the two layers may include the color conversion particles 211. The color conversion particles 211 including the perovskite compound may be selectively included according to the light incident on the first color conversion layer 210a and the second color conversion layer 210b. These first and second color conversion layers 210a and 210b may be used selectively used depending on the characteristics and use of the color conversion element 10, the taste of a user, and the like, the present disclosure is not limited thereto.

For example, the first color conversion layer 210a may include first color conversion particles 211a configured to convert the first light L1 into the second light L2, and the second color conversion layer 210b may include second color conversion particles 211b configured to convert the first light L1 into the third light L3. As described above, the first color conversion particles 211a and the second color conversion particles 211b may include the perovskite compounds having different elements in Formula 1 and may have different light conversion characteristics.

Figure 14:
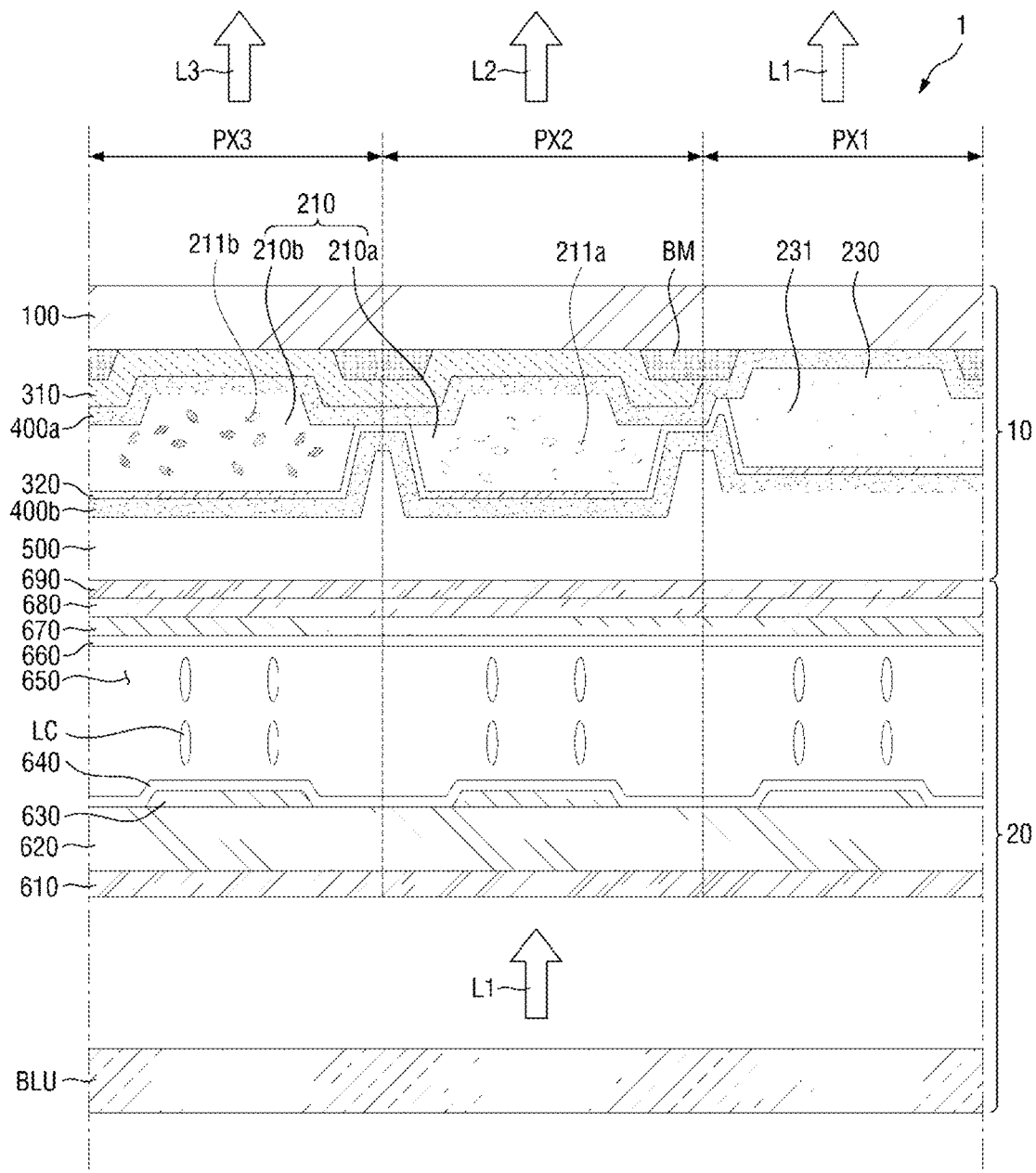
FIGS. 14-15 are cross-sectional views of display devices according to embodiments.
Figure 15:
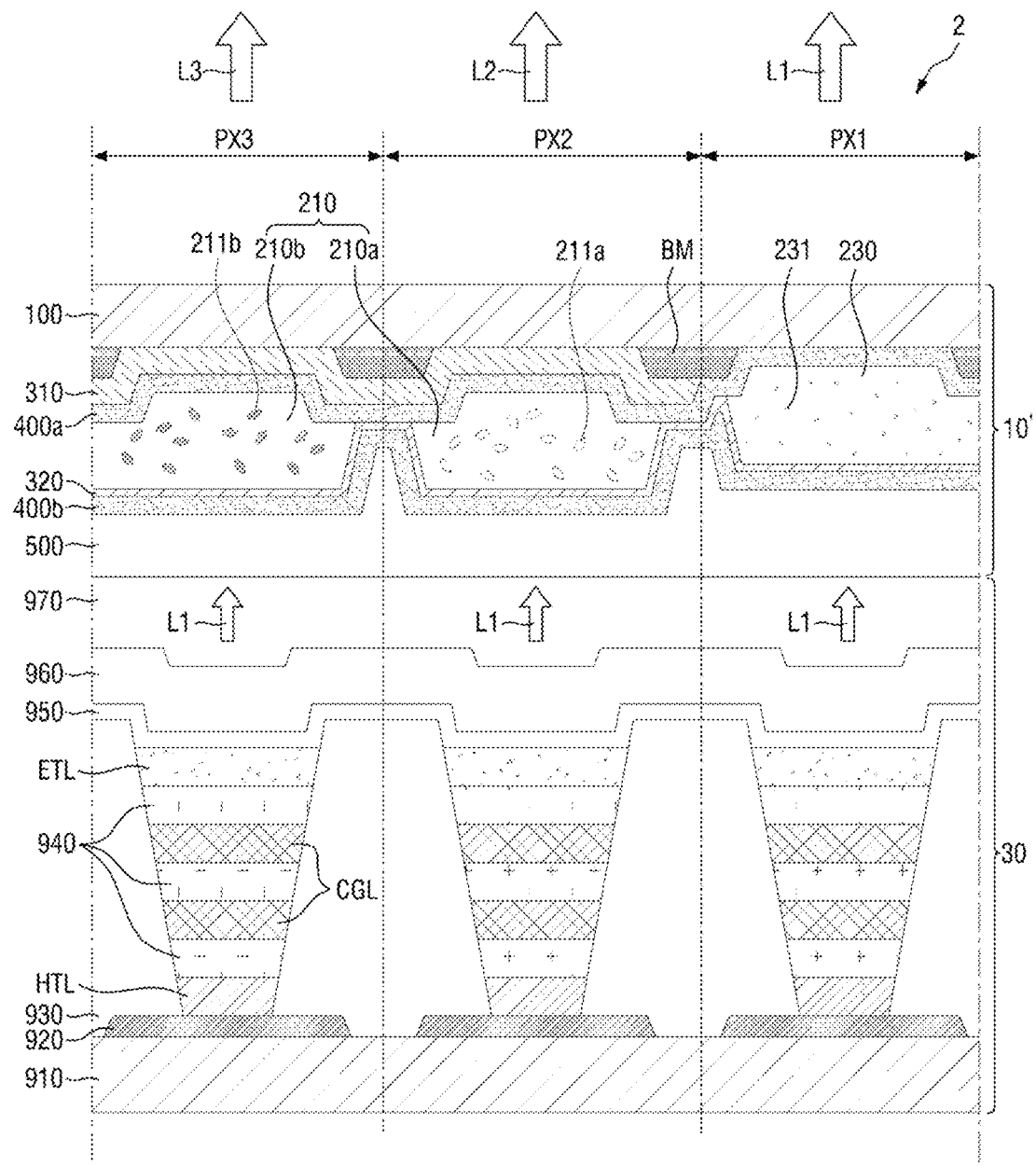

The light emitted from the color conversion particles 211 included in the color conversion layer 210 is incident on the color filter layer 310, and only arbitrary light is transmitted through the color filter layer and finally displayed on the display device (shown in FIGS. 14-15). Further details thereof will be described later herein.

When light is incident on the color conversion particles 211, the wavelength of the incident light is converted, and then the light having the converted wavelength is emitted, the emission direction thereof has random scattering characteristics (Lambertian emission). Therefore, although the color conversion layer 210 including the color conversion particles 211 does not include scatterers, the front and side luminance of the light emitted from the color conversion layer 210 may be uniform (e.g., substantially uniform). However, the color conversion layer 210 may further include scatters so as to increase the light conversion efficiency. As the scatterers, the scatterer 231 included in the color light transmitting layer 230 to be described later may be used, but the present disclosure is not limited thereto.

The color conversion particles 211 and the scatterers 231 may be dispersed in the light transmitting resin R and may be included in the color conversion layer 210 and the color light transmitting layer 230, respectively. The light transmitting resin R is not particularly limited as long as it is a transparent medium within a range that does not cause absorption of light without affecting the wavelength conversion performance of the color conversion particles 211. For example, the light transmitting resin R may include any suitable resin available in the art that is configured to transmit a suitable amount of light and allows for suitable light absorption and emission by the color conversion particles. In an exemplary embodiment, the light transmitting resin R may include an organic material such as an epoxy resin or an acrylic resin, but the present disclosure is not limited thereto.

Meanwhile, low refractive layers 400a and 400b may be over and under the color conversion layer 210 and the color light transmitting layer 230, respectively. The low refractive layers 400a and 400b may include a first low refractive layer 400a and a second low refractive layer 400b, which are over and under the color conversion layer 210 and the color light transmitting layer 230, respectively. For example, the low refractive layers 400a and 400b may be arranged so as to surround the upper and lower portions of the color conversion layer 210 and the color light transmitting layer 230.

The low refractive layers 400a and 400b may be on at least a part of each of the sides of the color conversion layer 210 and the color light transmitting layer 230. For example, as shown in the drawing, the second low refractive layer 400b may cover not only the upper portions of the color conversion layer 210 and the color light transmission layer 230 but also the side portions thereof.

The first low refractive layer 400a may be arranged as an integrated single layer under the first color conversion layer 210a, the second color conversion layer 210b, and the color light transmitting layer 230. However, the present disclosure is not limited thereto, and the first low refractive layer 400a may be configured such that layers separated from each other are under the color conversion layer 210 and the color light transmitting layer 230, respectively. In this case, the first refractive layer 400a may not be under some of the first color conversion layer 210a, the second color conversion layer 210b, and the color light transmitting layer 230. The second low refractive layer 400b may also not be located thereunder.

Each of the low refractive layers 400a and 400b, which is a layer having a lower refractive index than each of the color conversion layer 210 and the color light transmitting layer 230, may induce total reflection of light traveling from the color conversion layer 210 to the color light transmitting layer 230 to recycle the light.

As an example, the first low refractive layer 400a may be configured such that light to be transmitted through the color conversion layer 210 without passing through the color conversion particles 211, of the light incident from the lower portion of the first low refractive layer 400, is reflected upwards and incident on the color conversion particles 211. The second low refractive layer 400b may reflect the light scattered upward by the color conversion particles 211 in the color conversion layer 210 and the scatterers in the color light transmitting layer 230 downward to recycle the light. A portion of the second low refractive layer 400b, on the side surfaces of the color conversion layer 210 and the color light transmitting layer 230, may perform the aforementioned roles selectively or all. Since each the low refractive layers 400a and 400b is on at least one side of each of the color conversion layer 210 and the color light transmitting layer 230, light is recycled, so that the light efficiency of the color conversion element can be improved.

Here, each the low refractive layers 400a and 400b may have a refractive index of 1.3 or less. When each the low refractive layers 400a and 400b has a refractive index of 1.3 or less, a difference in refractive index with the color conversion layer 210 or the color light transmitting layer 230 is large, so that the total reflection of light may sufficiently occur.

In an exemplary embodiment, each the low refractive layers 400a and 400b may include hollow inorganic particles and a resin. The hollow inorganic particles may be dispersed in the resin.

Each of the inorganic particles may include at least one selected from the group consisting of silica ($SiO_2$), magnesium fluoride ($MgF_2$), and iron oxide ($Fe_3O_4$). For example, each of the inorganic particles may include a shell made of at least one of the aforementioned materials and a hollow defined in the shell and surrounded by the shell.

The resin may include at least one selected from the group of acrylate, polysiloxane, fluorinated-polysiloxane, polyurethane, fluorinated-polyurethane, polyurethane-acrylate, fluorinated-polyurethane-acrylates, a cardo binder, polyimide, polymethylsilsesquioxane (PMSSQ), poly(methylmethacrylate) (PMMA), and a PMSSQ-PMMA hybrid.

The low refractive layers 400a and 400b may be formed in such a manner that a solution containing inorganic particles, a resin, a solvent, a photoreactive group, and an additive is applied, baked and/or photo-cured. The solvent, photoreactive group and additives contained in the solution may be removed by evaporation or reaction during the baking/curing process.

Meanwhile, referring to FIGS. 1-2, the color filter layer 310 may be under the color conversion layer 210. For example, the color filter layer 310 may be between the base substrate 100 and the color conversion layer 210.

In an embodiment, the color filter layer 310 may transmit the light emitted from the color conversion layer 210, and block at least a part of the light. For example, the color filter layer 310 may be a wavelength-selective optical filter layer configured to absorb or reflect light having any suitable wavelength band and provided from a light source and transmitting light having a different wavelength band from the any wavelength band.

As described above, the color conversion element 10 may be coupled such that its upper portion faces the display element (shown in FIGS. 14-15), based on FIG. 1. In this case, the first light L1 emitted from the display element may be first incident on the color conversion layer 210, converted into the second light L2 or the third light L3, and then incident on the color filter layer 310. In this case, a part of the first light L1 incident on the color conversion layer 210 may be directly transmitted through the color conversion layer 210 without passing through the color conversion particles 211. In this case, the color filter layer 310 may block the transmission of the first light L1 to improve the color purity of the second light L2 and/or the third light L3 emitted from the color conversion layer 210.

In an embodiment, the color filter layer 310 may be under the first color conversion layer 210a and the second color conversion layer 210b, and may not be under the color light transmitting layer 230. For example, the color filter layer 310 may include a first color filter layer 310a and a second color filter layer 310b, which are respectively under the first color conversion layer 210a and the second color conversion layer 210b. The first color filter layer 310a and the second color filter layer 310b may be arranged as an integrated single layer under the color conversion layer 210. However, the present disclosure is not limited thereto. As another embodiment, which will be described later, layers separated from each other may be under the first color conversion layer 210a and the second color conversion layer 210b, respectively.

According to another embodiment, the color filter layer 310 may include a third color filter layer 310c under the color light transmitting layer 230. In this case, as an example, the third color filter layer 310c may transmit the first light L1 passing through the color light transmitting layer 230, and may absorb or reflect light other than the first light L1.

Meanwhile, an optical filter layer 320 may be on the color conversion layer 210. For example, the optical filter layer 320 may be on a surface other than the outer surface of the color conversion layer 210, contacting the base substrate. In an embodiment, the optical filter layer 320 may be between the color conversion layer 210 and the second low refractive layer 400b.

The optical filter layer 320 may reflect the second light L2 and the third light L3. For example, the optical filter layer 320 may be a color filter layer or wavelength-selective optical filter layer configured to transmit the first light L1 and configured to reflect the light having a wavelength band longer than that of the first light L1, for example, the second light L2 and the third light L3.

As described above, the color conversion element 10 may be coupled such that its upper portion faces the display element (shown in FIGS. 14-15), based on FIG. 1. In this case, a part of the second light L2 or the third light L3 may be scattered toward the optical filter layer 320 by the color conversion particles 211a and 211b. In this case, the optical filter layer 320 is configured to reflect the second light L2 and the third light L3 in the outgoing direction of the color conversion element 10, for example, in the downward direction in FIG. 1, and thus the luminance and light conversion efficiency for the second light L2 and the third light L3 can be improved. Further, the optical filter layer 320 may reflect the light emitted from the color conversion particles 211, thereby recycling the light.

However, since the second low refractive layer 400b over the color conversion layer 210 may also reflect the light scattered upward in the downward direction by the color conversion particles 211a and 211b, when the second low refractive layer 400b is present, the optical filter layer 320 may be omitted as in another embodiment to be described later herein.

The optical filter layer 320 may include at least one layer including an inorganic material. Here, inorganic material may be at least one of silicon oxide (SiOx), silicon nitride (SiNx), and silicon oxynitride (SiOxNy).

In an exemplary embodiment, the optical filter layer 320 may include a plurality of low refractive layers and a plurality of high refractive layers, which are alternately laminated. The low refractive layer of the optical filter layer 320 may refer to a layer having a relatively low refractive index as compared with the adjacent layer, and the high refractive layer may refer to a layer having a relatively high refractive index as compared with the adjacent layer. The transmission wavelength band and reflection wavelength band of the optical filter layer 320 may be controlled through the materials of the low refractive layer and the high refractive layer, the difference in thickness between the layers, and the difference in refractive index between the layers. However, the present disclosure is not limited thereto.

The optical filter layer 320 may include a silicon nitride layer and a silicon nitride layer, which are alternately laminated. In another embodiment, the low refractive layer may be formed of a silicon oxide, and the high refractive layer may be formed of a metal oxide such as titanium oxide ($TiO_2$), tantalum oxide ($TaO_x$), hafnium oxide ($HfO_x$) or zirconium oxide ($ZrO_x$). However, the structure of the optical filter layer 320 is not limited thereto.

The light filter layer 320 may be arranged as an integrated single layer on the color conversion layer 210 and the color light transmitting layer 230. However, the present disclosure is not limited thereto. The optical filter layer 320 may be located only on the color conversion layer 210, and layers separated from each other may be on the first color conversion layer 210a, the second conversion layer 210b, and the color light transmitting layer 230, respectively.

The overcoat layer 500 may be over the color conversion layer 210, the color light transmitting layer 230, the light blocking member BM, and the like. The overcoat layer 500 may be a planarization layer that minimizes or reduces the step occurring when the members on the base substrate 100 are laminated. The overcoat layer 500 may be arranged to cover all of the layers on the base substrate 100 without dividing the color conversion layer 210 and the color light transmitting layer 230.

The overcoat layer 500 may be made of an organic material having planarization properties. For example, the overcoat layer 500 may be made of a thermosetting resin. The overcoat layer 500 may include at least one selected from the group consisting of cardo resin, polyimide resin, acrylic resin, siloxane resin, and silsesquioxane resin, as an organic material.

Hereinafter, color conversion elements according to various embodiments of the present disclosure will be described. First, FIG. 5 is a cross-sectional view of a color conversion element 11 according to another embodiment, and FIG. 6 is an enlarged view of the portion C in FIG. 5.

Figure 5:
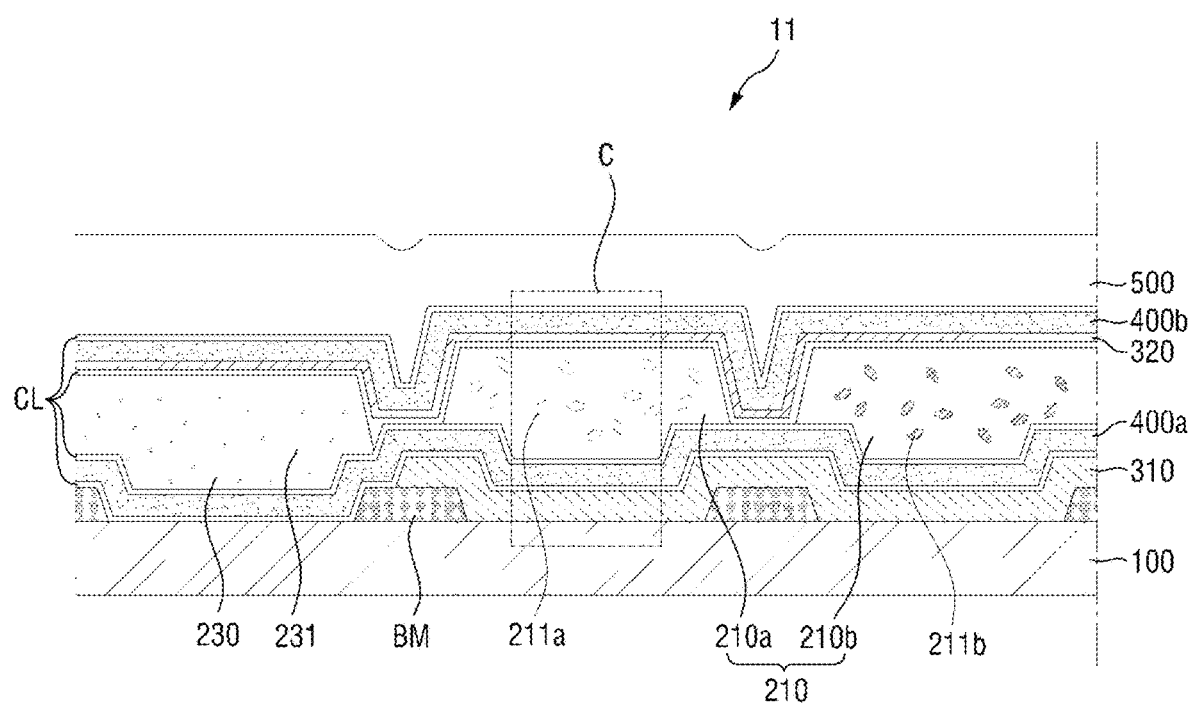
FIG. 5 is a cross-sectional view of a color conversion element according to another embodiment.
Figure 6:
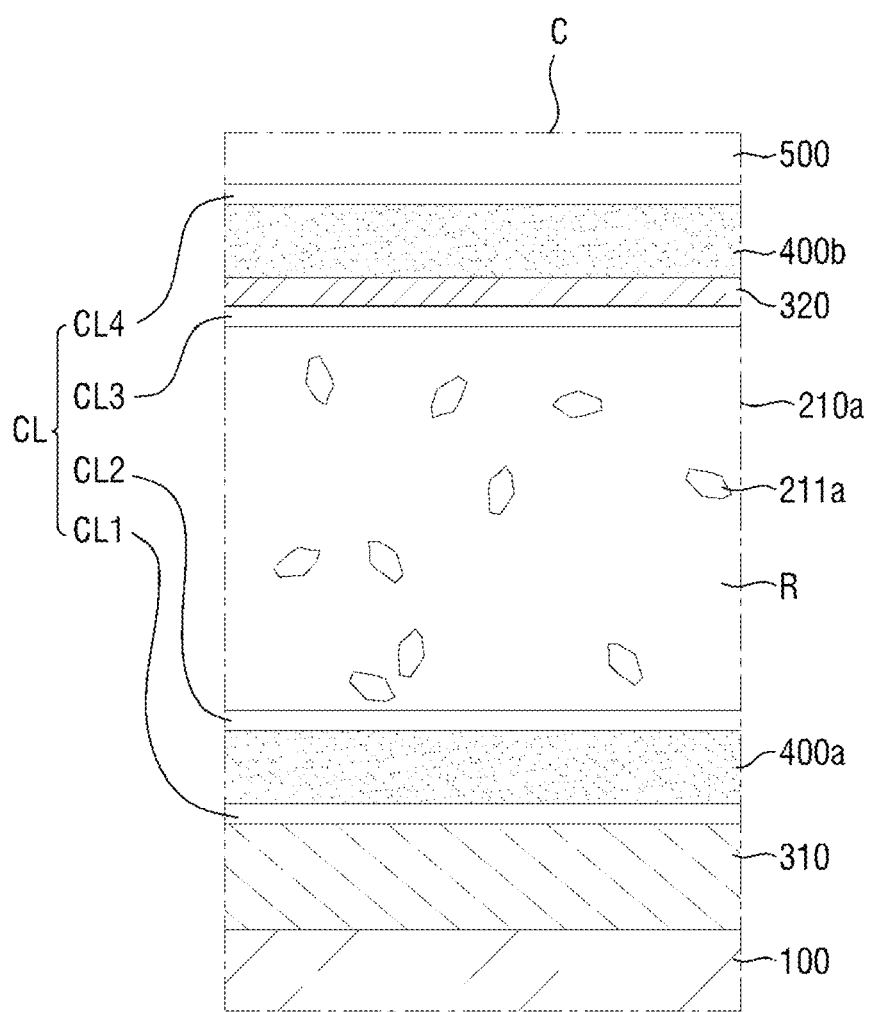
FIG. 6 is an enlarged view of the portion C in FIG. 5.

The color conversion element 11 of FIGS. 5-6 is substantially the same as the aforementioned color conversion element 10 of FIGS. 1-4, except that the color conversion element 11 further includes a plurality of capping layers CL on and under the plurality of low refractive layers 400a and 400b. Hereinafter, duplicative descriptions of features that have already been described herein will not be repeated, and the differences will be mainly described instead.

Referring to FIGS. 5-6, the plurality of capping layers CL may be on and under the plurality of low refractive layers 400a and 400b. For example, the first capping layer CL1 and the second capping layer CL2 may be on and under the first low refractive layer 400a, respectively, and the third capping layer CL3 and the fourth capping layer CL4 may be on and under the second low refractive layer 400b, respectively.

The plurality of capping layers CL may be directly on the low refractive layers 400a and 400b to contact the low refractive layers 400a and 400b. However, the present disclosure is not limited thereto. The capping layers CL may be spaced apart from each other with the optical filter layer 320 therebetween, like the third capping layer CL3. As described above, when the optical filter layer 320 is a layer including an inorganic material, the optical filter layer 320 may also serve to protect the second refractive layer 400b, and, as will be described later, the third capping layer CL3 may be omitted.

Each of the capping layers CL may include an inorganic material. For example, each of the capping layers CL may include at least one of silicon oxide (SiOx), silicon nitride (SiNx), and silicon oxynitride (SiOxNy).

The low refractive layers 400a and 400b may be impregnated with a solvent or a developer by an adjacent organic material layer or infiltrated with outgas by baking in a subsequent process to be damaged. Accordingly, the refractive index thereof increases, and thus the total reflection function of light may be deteriorated. In some embodiments, since the color conversion layer 210, the color filter layer 310, and the overcoat layer 500 may include an organic material, the functions of the adjacent low refractive layers 400a and 400b may be deteriorated.

The plurality of capping layers CL made of an inorganic material may physically separate and protect each of the low refractive layers 400a and 400b from the adjacent organic material layers to prevent the refractive index of each of the low refractive layers 400a and 400b from increasing.

Figure 7:
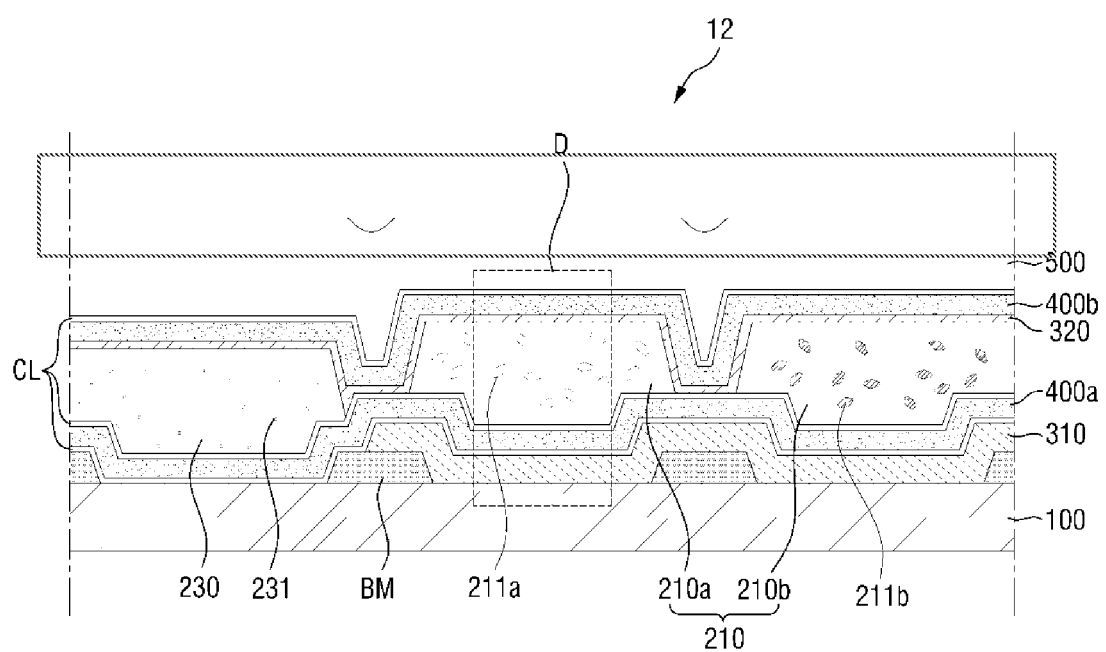
FIG. 7 is a cross-sectional view of a color conversion element according to another embodiment.
Figure 8:
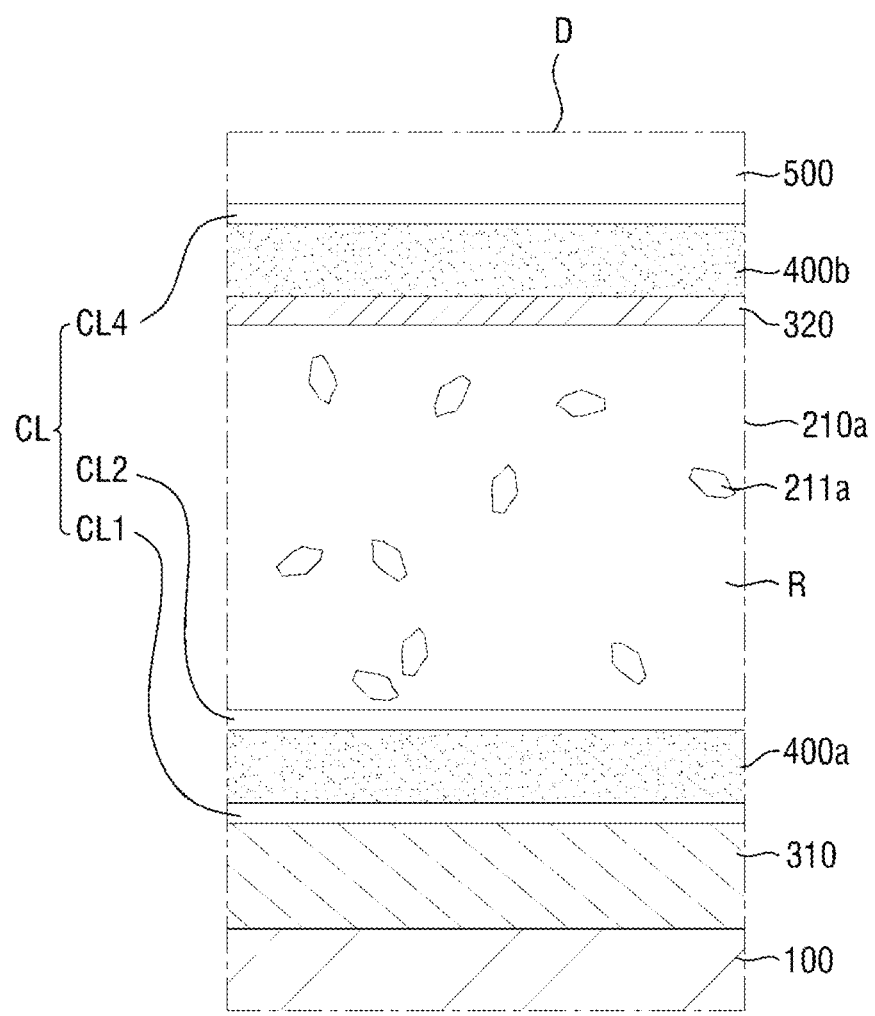
FIG. 8 is an enlarged view of the portion D in FIG. 7.

FIG. 7 is a cross-sectional view of a color conversion element 12 according to another embodiment. FIG. 8 is an enlarged view of the portion D in FIG. 7.

The color conversion element 12 of FIGS. 7-8 is substantially the same as the aforementioned color conversion element 11 of FIGS. 5-6, except that the third capping layers CL3 is omitted. Hereinafter, duplicative descriptions of features that have already been described herein will not be repeated, and the differences will be mainly described instead.

Referring to FIGS. 7-8, the third capping layer CL3 under the second low refractive layer 400b, for example, between the second low refractive layer 400b and the color conversion layer 210 may be omitted. In this case, the optical filter layer 320 may be formed of a layer including an inorganic material as described above, and may serve to protect the second low refractive layer 400b. Further, the optical filter layer 320 may be composed of a single layer including at least one of the exemplified inorganic materials.

Figure 9:
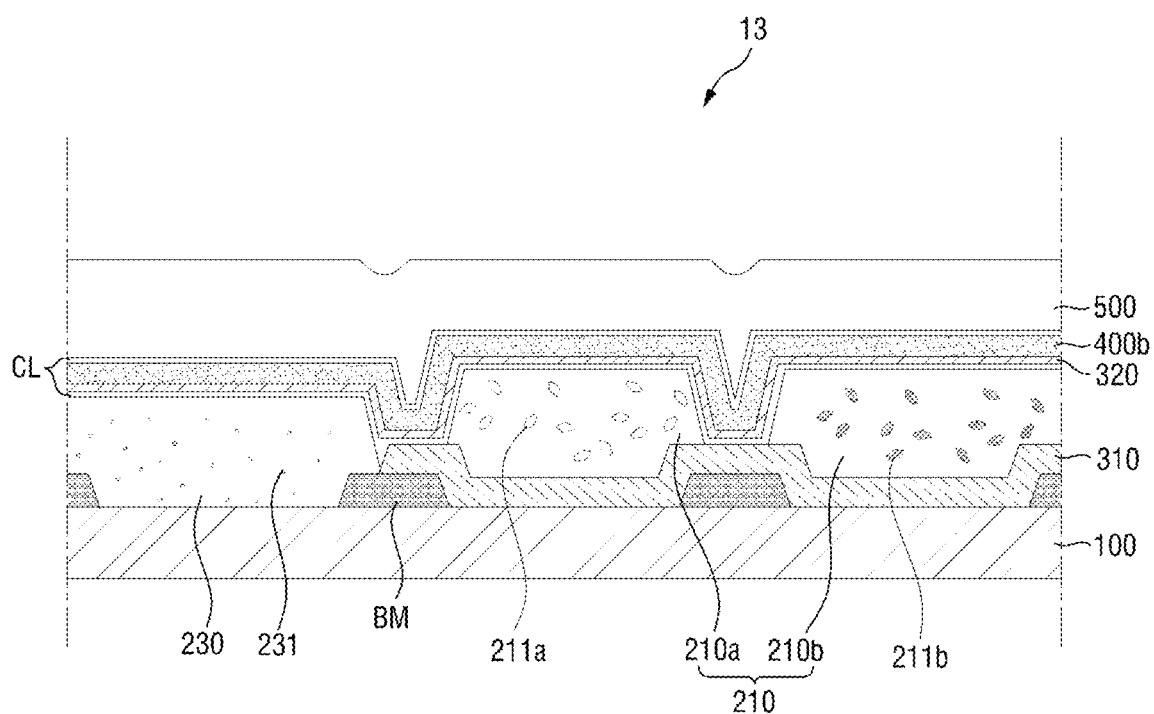
FIGS. 9-13 are cross-sectional views of color conversion elements according to other embodiments.
Figure 10:
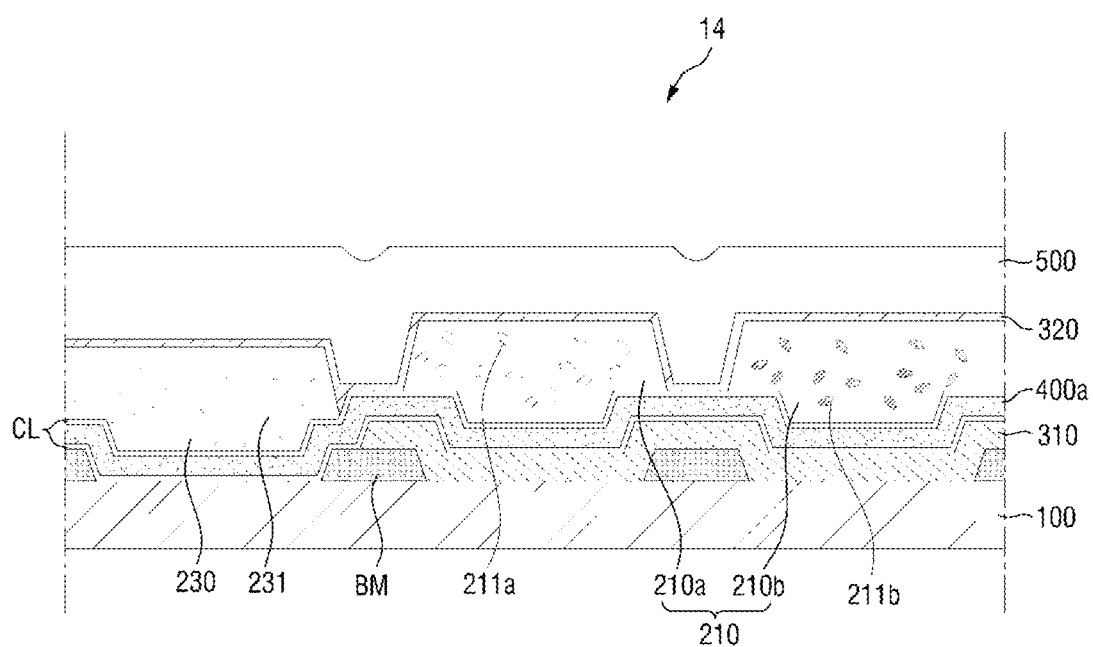

FIGS. 9-10 are cross-sectional views of color conversion elements 13 and 14 according to other embodiments.

The color conversion elements 13 and 14 are substantially the same as the color conversion element 11 of FIG. 5, except that the first low refractive layer 400a and the second low refractive layer 400b are omitted.

As shown in FIGS. 9-10, the first refractive layer 400a under the color conversion layer 210 and the second refractive layer 400b thereover may be suitably added or subtracted depending on the application field of the color conversion elements 13 and 14, the taste of a user, and the like.

Figure 11:
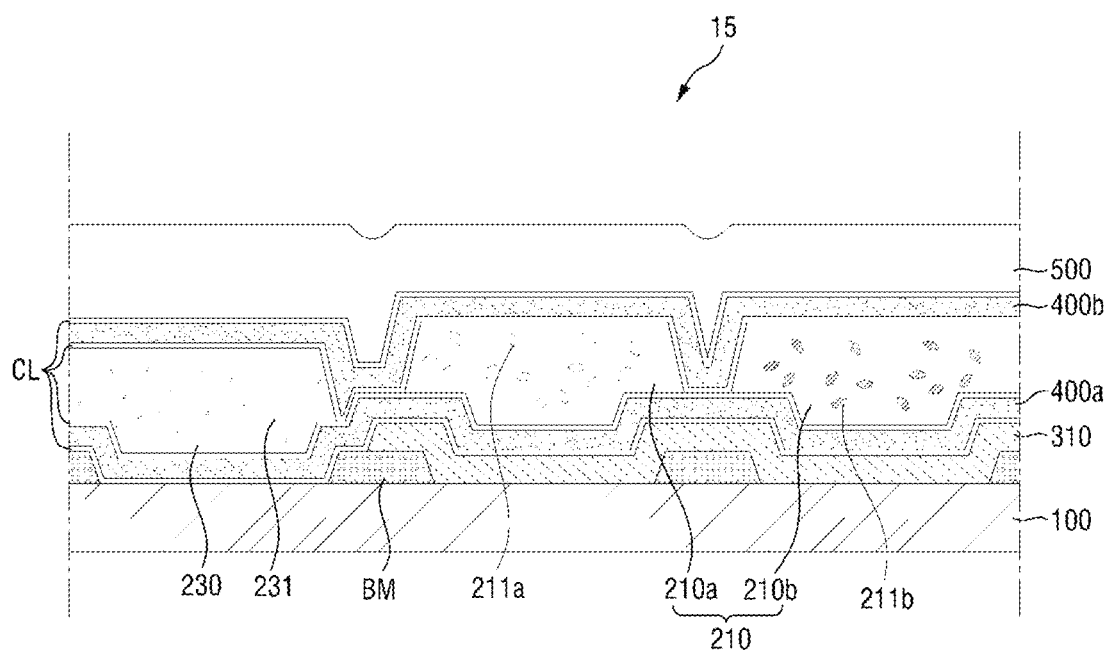

FIG. 11 is a cross-sectional view of a color conversion element 15 according to another embodiment.

The color conversion element 15 of FIG. 11 is substantially the same as the aforementioned color conversion element 11 of FIG. 5, except that the optical filer layer 320 is omitted. Hereinafter, duplicative descriptions of features that have already been described herein will not be repeated, and the differences will be mainly described instead.

Referring to FIG. 11, the optical filter layer 320 between the color conversion layer 210 and the second refractive layer 400b may be omitted.

Since the second low refractive layer 400b over the color conversion layer 210 can reflect the light upwardly scattered by the color conversion particles 211 in a downward direction, the second low refractive layer 400b may include the function of the optical filter layer 320, so that the optical filter layer 320 may not be included (e.g., the optical filter layer 320 may be omitted).

Figure 12:
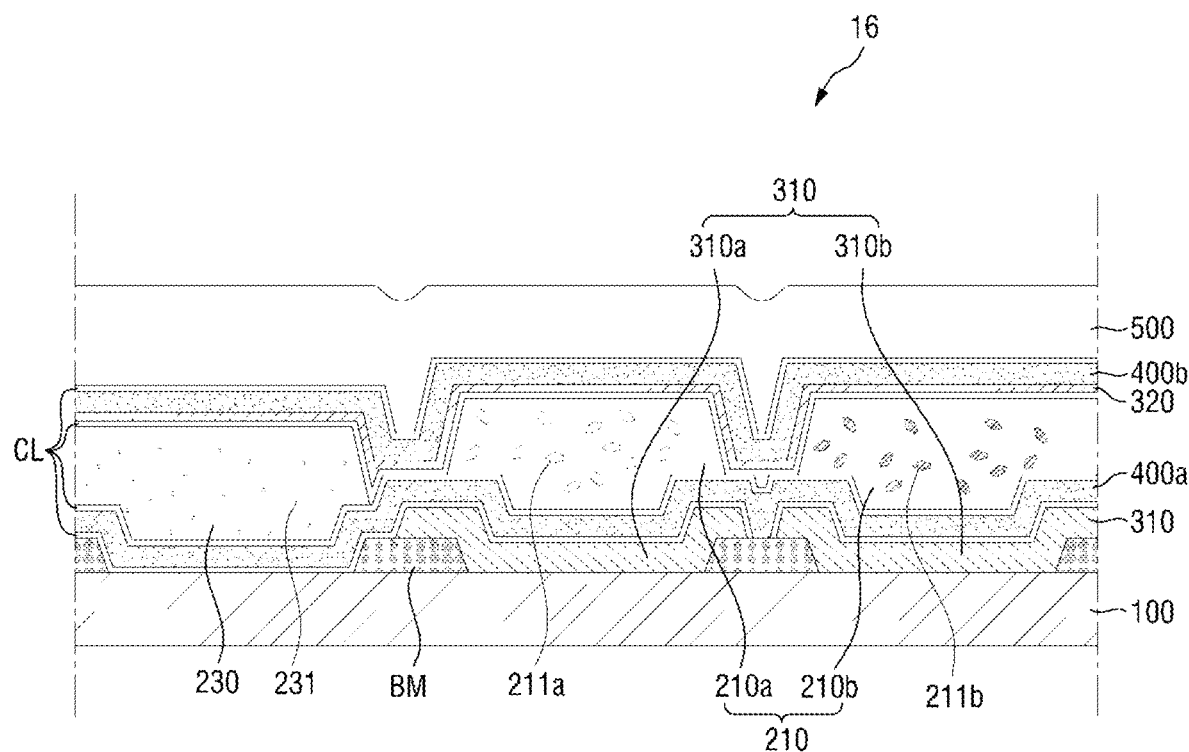
Figure 13:
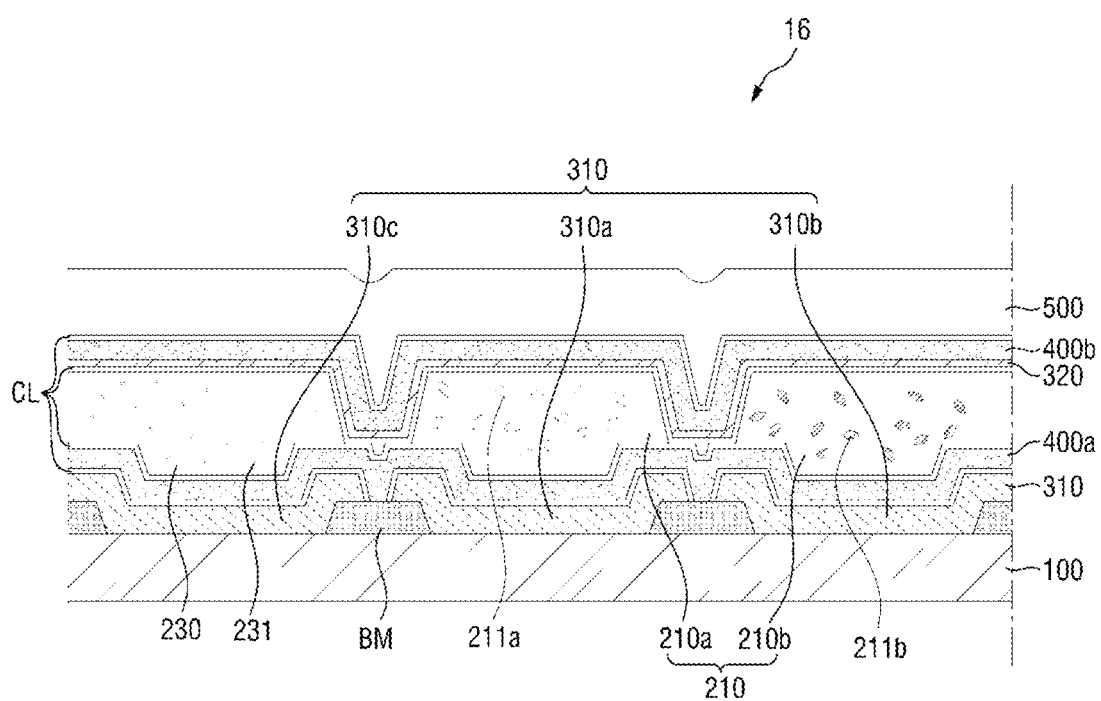

FIGS. 12-13 are cross-sectional views of a color conversion element 16 according to another embodiment.

The color conversion element 16 of FIG. 12 is substantially the same as the aforementioned color conversion element 11 of FIG. 5, except that the color filter layer 310 is divided into a first color filter layer 310a and a second color filter layer 310b. Hereinafter, duplicative descriptions of features that have already been described will not be repeated, and the differences will be mainly described instead.

Referring to FIG. 12, the color filter layer 310 may be divided into a first color filter layer 310 under the first color conversion layer 210a and a second color filter layer 310b under the second color conversion layer 210b.

The first color filter layer 310a may block the first light L1 and transmit the second light L2, the first light L1 and the second light L2 being emitted from the first color conversion layer 210a. The second color filter layer 310b may block the first light L1 and transmit the third light L3, the first light L1 and the third light L2 being emitted from the second color conversion layer 210b. In other words, the first color filter layer 310a and the second color filter layer 310b may transmit only the second light L2 and the third light L3, respectively.

In an exemplary embodiment, the first color filter layer 310a may include an organic film having a yellow or green color, and the second color filter layer 310b may include an organic film having a red color. However, the present disclosure is not limited thereto, and each of the first color filter layer 310a and the second color filter layer 310b may include an organic film having a yellow color.

Meanwhile, as shown in FIG. 13, in the color conversion element 16 according to another embodiment, the color filter layer 310 may further be located even under the color light transmitting layer 230. The color conversion element 16 of FIG. 13 is substantially the same as that described with reference to FIG. 12, except that a third color filter layer 310c is under the color light transmitting layer 230. Hereinafter, duplicative descriptions of features that have already been described will not be repeated, and the differences will be mainly described instead.

Referring to FIG. 13, the color filter layer 310 may further include a third color filter layer 310c under the color light transmitting layer 230. The third color filter layer 310c may transmit only the first light L1 and block light having other wavelength bands. In an exemplary embodiment, the third color filter layer 310c may include an organic film having a blue color, but the present disclosure is not limited thereto.

Hereinafter, a display device including the above-mentioned color conversion element 10 will be described.

FIGS. 14-15 are cross-sectional views of display devices 1 and 2 according to embodiments of the present disclosure.

Referring to FIGS. 14-15, the display device 1 includes a display element 20 and a color conversion element located to face the display element 20, and the display device 2 includes a display element 30 and a color conversion element 10 located to face the display element 30. The color conversion element is on each of the display elements 20 and 30, and may be located upward based on FIGS. 14-15.

A plurality of pixels PX1, PX2, and PX3 arranged in a substantially matrix form in a plane may be defined in each of the display devices 1 and 2. As used herein, the 'pixel' may refer to a single area defined by dividing a display area for color display in a plan view, and one pixel may refer to a minimum unit capable of expressing colors independently of other pixels. For example, each of the pixels PX1, PX2, and PX3 may uniquely express one of basic colors to implement color display. For example, the plurality of pixels PX1, PX2 and PX3 include a first pixel PX1 for expressing the color of first light L1, a second pixel PX2 for expressing the color of second light L2, and a third pixel PX3 for expressing the color of third light L3. The first pixel PX1, the second pixel PX2, and the third pixel PX3 adjacent to each other may be repeatedly arranged in a basic unit. However, the present disclosure is not limited thereto.

The color light transmitting layer 230, the first color conversion layer 210a, and the second color conversion layer 210b may be located in regions corresponding to the first pixel PX1, the second pixel PX2, and the third pixel PX3. However, this is only one example, the matching relationship among the color conversion layer 210, the color light transmitting layer 230, and the plurality of pixels PX1, PX2, and PX3 may be changed.

The color conversion element 10 has been described above. Hereinafter, the display elements 20 and 30 will be described with reference to FIGS. 14-15.

First, the display element 20 included in the display device 1 will be described with reference to FIG. 14. The display element 20 may include a backlight unit BLU, a lower substrate 620, a pixel electrode 630, a liquid crystal layer 650, a common electrode 670, a lower alignment layer 640, an upper alignment layer 660, an upper substrate 680, a lower polarizing element 610, and an upper polarizing element 690.

According to an embodiment, the display element 20 may include a lower substrate 620, an upper substrate 680 facing the lower substrate 620, a liquid crystal layer 650 between the lower substrate 620 and the upper substrate 680, and a backlight unit BLU at a side opposite to the color conversion element 10, for example, at a side of the lower substrate 620.

The backlight unit BLU may be under the display element 20 to provide light having a set or specific wavelength to the display element 20. The backlight unit BLU may include a light source configured to directly emit light, and a light guide plate configured to guide the light emitted from the light source and configured to transmit the light toward the display element 20.

In an exemplary embodiment, the light source may emit the first light L1. For example, the backlight unit BLU may provide the first light L1 of a blue color to the display element 20.

In another embodiment, the light source may emit light having a peak wavelength in the ultraviolet band, and the backlight unit BLU may provide the ultraviolet light to the display element 20. Further, as described above, the blue light of the backlight unit BLU may be converted into green light in the color conversion element 10 including the perovskite compound to have high light conversion efficiency and luminance.

The lower substrate 620 may be on the backlight unit BLU. The lower substrate 620 may include a switching element, a driving element, and the like, which constitute a thin film transistor, and a plurality of insulating layers. For example, the lower substrate 620 may be a thin film transistor substrate for controlling the alignment of the liquid crystals thereon.

The pixel electrode 630 may be included for each of the pixels PX1, PX2, and PX3 on the lower substrate 620. The common electrode 670 may be disposed on the upper side of the pixel electrode 630 regardless of the pixels. The liquid crystal layer 650 may include liquid crystals LC, and may be interposed between the pixel electrode 630 and the common electrode 670. The liquid crystals LC have negative dielectric anisotropy, and may be vertically aligned in the initial alignment state.

When an electric field is formed between the pixel electrode 630 and the common electrode 670, the liquid crystals LC may change the polarization state of light transmitted through the liquid crystal layer 650 by tilting or rotating in a set or specific direction.

In another embodiment, the liquid crystals LC have positive dielectric anisotropy, and may be horizontally aligned in the initial alignment state.

The lower alignment layer 640 may be between the pixel electrode 630 and the liquid crystal layer 650, and the upper alignment layer 660 may be between the common electrode 670 and the liquid crystal layer 650. The lower alignment layer 640 and the upper alignment layer 660 may induce the liquid crystals LC to have a small pretilt angle in the initial alignment state.

The upper substrate 680 may support the common electrode 670. The upper substrate 680 may include a switching element, a driving element, and the like, which constitute a thin film transistor, and a plurality of insulating layers. For example, the upper substrate 680 may be a thin film transistor substrate for controlling the alignment of the liquid crystals thereon.

The lower polarizing element 610 may be between the backlight unit BLU and the lower substrate 620, and the upper polarizing element 690 may be between the upper substrate 680 and the color conversion element 10. Each of the lower and upper polarizing elements 610 and 690 may be an absorptive polarizing element or a reflective polarizing element. For example, an absorptive polarizing element may absorb a polarization component parallel (e.g., substantially parallel) to the absorption axis and transmit a polarization component parallel (e.g., substantially parallel) to the transmission axis to impart polarization to the transmitted light. The lower and upper polarizing elements 610 and 690 perform an optical shutter function together with the liquid crystal layer 650 to control the amount of transmitted light for each of the pixels PX1, PX2 and PX3.

The layout positions of the lower and upper polarizing elements 610 and 690 are not limited to those shown in FIG. 14. The lower polarizing element 610 may be between the lower substrate 620 and the liquid crystal layer 650, and the upper polarizing element 690 may be between the common electrode 670 and the liquid crystal layer 650.

As described above, the display element 20 may be a liquid crystal display element capable of displaying an image by controlling transmitted light through the control of the liquid crystal layer 650, and the light source configured to transmit light to the color conversion element 10 may be a backlight unit BLU of a liquid crystal display element.

The light emitted from the light source of the display element 20 is emitted from the display element 20 through the backlight unit BLU and the liquid crystal layer 650 and is incident on the color conversion element 10, and sequentially passes through the overcoat layer 500, second low refractive layer 400b, optical filter layer 320, color conversion layer 210 or color light transmitting layer 230, first low refractive layer 400a, color filter layer 310, and base substrate 100 of the color conversion element 10 and emitted to the outside of the display device 1. In this procedure, the light scattered toward the display element 20 again by the color conversion particles 211 or the scatterers 231 is recycled, thereby improving the light efficiency, luminance and the like of the display device 1.

Meanwhile, the display element 20 of the present disclosure is not limited to the aforementioned liquid crystal display element. According to another embodiment, as shown in FIG. 15, the display element 30 may be an organic light emitting display element 30.

The organic light emitting display element 30 may have a structure in which a light emitting layer is included for each pixel. In this case, the light source of the organic light emitting display device may be the light emitting layer, and the light emitting layer may transmit light to the color conversion element 10 thereon. The light emitting layer may be formed of a single layer or multiple layers configured to emit blue light, but the present disclosure is not limited thereto. Further, unlike the case that the color conversion element 10 is fabricated in the form of a separate panel and is attached to the liquid crystal display element 20 as described above, the color conversion element 10 may be directly formed on the organic light emitting display device.

Hereinafter, a case where the display element 30 according to another embodiment of the present disclosure is an organic light emitting display element will be described with reference to FIG. 15.

FIG. 15 is a cross-sectional view of a display device 2 according to another embodiment of the present disclosure. The display device 2 of FIG. 15 is substantially the same as the display device 1 described with reference to Fl. 14, except that the display element 30 of FIG. 15 is not the liquid crystal display element 20 but the organic light emitting display element 30. Hereinafter, duplicative descriptions of features that have already been described herein will not be repeated, and the differences will be mainly described instead.

Referring to FIG. 15, the display device 2 includes a display element 30 and a color conversion element 10' directly on the display element 30.

The display element 30 may include a support substrate 910, a first electrode 920, a pixel defining layer 930, a light emitting layer 940, a second electrode 950, an encapsulation film 960, and a planarization layer 970.

The support substrate 910 provides a space in which components such as the light emitting layer 940 are located, and may be a driving substrate including a wiring for driving the display element 30, an electrode, a semiconductor, and an insulating film.

The pixel defining layer 930 may be on the support substrate 910. The pixel defining layer 930 can be made to assume the pixel number of the planar redundant pixel on the display element 30 through the opening. The pixel defining layer 930 may be configured to define a plurality of pixels in the display element 30 through an opening. The opening may expose at least a part of the first electrode 920 for each pixel.

The first electrode 920 may be on the support substrate 910. The first electrode 920 may be in a region corresponding to each of the pixels PX1, PX2, and PX3 of the display element 30. The first electrode 920 may be a pixel electrode or anode electrode of the display element 20. The second electrode 950 may be on the light emitting layer 940. The second electrode 950 may be arranged to cover both the light emitting layer 940 and the pixel defining layer 930. The second electrode 950 may be a common electrode or cathode electrode of the display element 30.

The light emitting layer 940 may be on the first electrode 920 exposed by the opening. The light emitting layer 940 may be an organic light emitting layer including an organic material that is configured to emit light by the formation of excitons of holes and electrons. The light emitting layer 940 may further include at least one of a hole injection layer, a hole transporting layer HTL, an electron transporting layer ETL, and an electron injection layer. Among these layers, the hole injection layer or the hole transporting layer HTL may be between the light emitting layer 940 and the first electrode 920, and the electron transporting layer ETL or the electron injection layer may be between the light emitting layer 940 and the second electrode 950.

Further, in an embodiment, as shown in FIG. 15, the light emitting layer 940 may have a structure in which the above-described organic light emitting layers are laminated. Here, an electron charge generation layer (CGL) may be further between the plurality of organic light emitting layers 940. The electron generating layer (CGL) may be composed of a plurality of layers, and may be between the plurality of light emitting layers 940 to induce the formation of excitons of holes and electrons.

Meanwhile, the plurality of light emitting layers 940 may emit light of a set or specific wavelength band, for example, light of a blue wavelength band. As shown in FIG. 15, in the case of a structure in which the plurality of light emitting layers 940, light of a blue wavelength band is emitted from several layers, so that the luminance of the organic display element 30 can be improved. In an embodiment, the light emitting layer 940 configured to emit blue light may be laminated, and the electron generating layer CGL may be between the plurality of light emitting layers 940.

In another embodiment, at least one light emitting layer configured to emit light of a blue wavelength band and light of a green wavelength band may be provided. When the blue light emitted from the display element 30 is converted into green light by the color conversion element 10, the light conversion efficiency of the blue light emitted from the display element 30 is lower than the light conversion efficiency of the blue light emitted through the color light transmitting layer 230, and thus the luminance of the display element 30 may be lowered. Accordingly, the display element 30 may be provided with the light emitting layer 940 configured to emit light of a green wavelength band, so as to improve the luminance for green light. For example, the display element 30 may have a structure in which one or more blue light emitting layers and one or more green light emitting layers are laminated and a charge generating layer is between the light emitting layers. In some embodiments, with the color conversion element 10 including the aforementioned perovskite compound, the luminance for green light and the light conversion efficiency can be maximized or increased. However, the present disclosure is not limited thereto.

The encapsulation film 960 may be arranged to seal the display element 30 to prevent foreign matter or moisture from penetrating into the light emitting layer 940, and the planarization layer 970 may flatten the upper surface of the display element 30 to allow the color conversion element 10' to be directly on the display element 30.

The color conversion element 10' may be on the display element 30, and as shown in FIG. 14, the color conversion layer 210 and the color light transmitting layer 230 may be aligned and located so as to correspond to the plurality of pixels PX1, PX2 and PX3 of the display element 30.

The color conversion element 10' may be directly on the display element 30 with the planarization layer 970 of the display element 30 as a base surface. Further, the vertical layout relationship of the color conversion elements 10' may be opposite to that of FIG. 14. For example, the second low refractive index layer 400b may be located at the upper side of the color conversion element 10', and the first low refractive index layer 400a may be on the lower side thereof. However, the present disclosure is not limited thereto. The color conversion element 10' may be arranged to be spaced apart the display element 30, and the vertical layout relationship of the color conversion element 10' may be the same as that shown in FIG. 14.

The first light L1 emitted from the light emitting layer 940 of the display element 30 is provided to the color conversion element 10', and the color conversion element 10' receives the first light L1 from the display element 30 and is configured to emit light of a color corresponding to each of the pixels PX1, PX2 and PX3 as described above. The light emitting layer 940 may be an organic light emitting layer that is configured to emit blue light, but is not limited thereto.

Hereinafter, a preparation example of the compound represented by Formula 1 according to an embodiment and the evaluation of optical characteristics using the same will be described.

Preparation Example

Preparation of $Cs_3Sb_2Br_9$

The preparation of $Cs_3Sb_2Br_9$ in the compound represented by Formula 1 above will be described.

In a method of preparing $Cs_3Sb_2Br_9$, 3 mmol of Cs-acetate and 9 mmol of SbBr are dissolved in ethanol, and then ethanol is evaporated to obtain yellow crystals. In order to make the yellow crystals into nanoparticles, planetary ball-milling is performed. The planetary ball-milling is performed for 120 hours or more to obtain $Cs_3Sb_2Br_9$.

In another method of preparing $Cs_3Sb_2Br_9$, 3 mmol of CsBr and 2 mmol of SbBr are dissolved in dimethylformamide, dimethyl sulfoxide or ethanol, and then 200 mL of oleylamine is added to obtain $Cs_3Sb_2Br_9$. Here, 20 ml of oleic acid is dissolved in 100 ml of an octane solution without using oleylamine, a solution containing CsBr and SbBr is poured and stirred to obtain $Cs_3Sb_2Br_9$.

Figure 16:
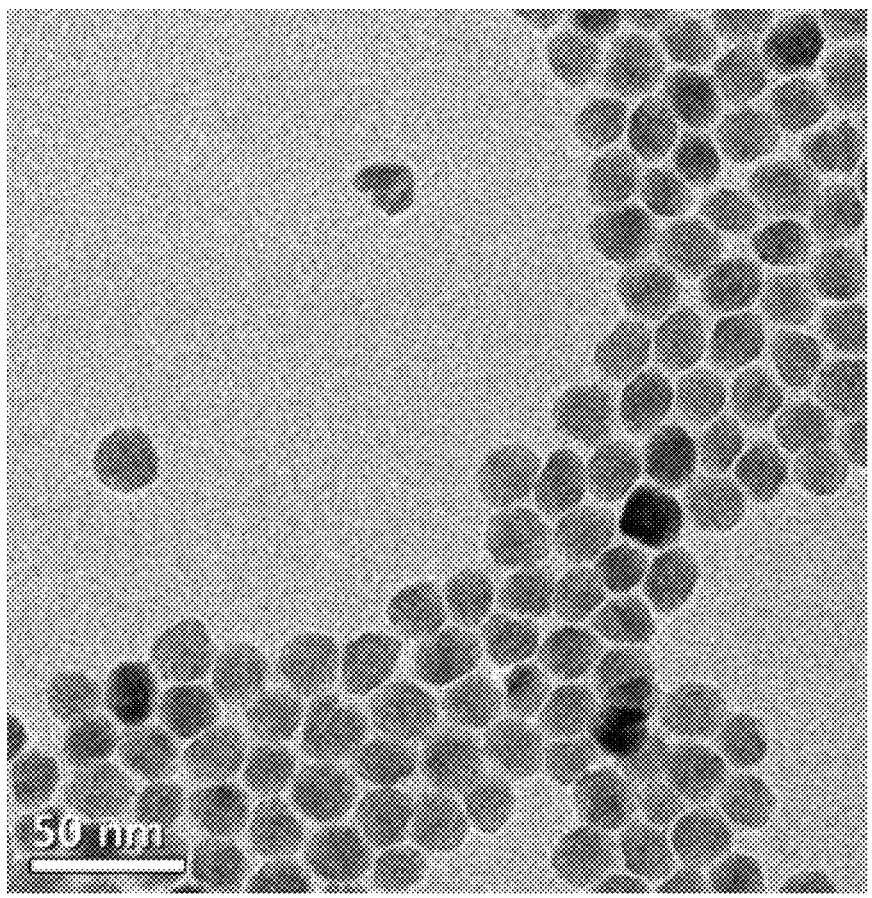
FIG. 16 is a transmission electron microscope (TEM) photograph of $Cs_3Sb_2Br_9$ according to Preparation Example.

FIG. 16 is a transmission electron microscope (TEM) photograph of $Cs_3Sb_2Br_9$ according to Preparation Example.

Referring to FIG. 16, it can be seen that $Cs_3Sb_2Br_9$ particles each have has a spherical or polygonal structure. Further, it can be seen that $Cs_3Sb_2Br_9$ particles is present in an aggregated state with other adjacent particles, and these aggregated particles constitute one nanocrystal.

Preparation of Photocurable Composite Resin

In order to evaluate the optical characteristics of the obtained $Cs_3Sb_2Br_9$, a photocurable composite resin is prepared.

First, Cs3Sb2Br9 is added in an amount of 5% to 20% by weight to a photocurable resin containing a photoinitiator, a monomer, a binder, and an additive. The photoinitiator forms a radical by ultraviolet rays of 365 nm, the monomer has six functional groups, and acrylate is used as the binder.

Experimental Example: Optical Characteristic Measurement Data of $Cs_3Sb_2Br_9$

Figure 17:
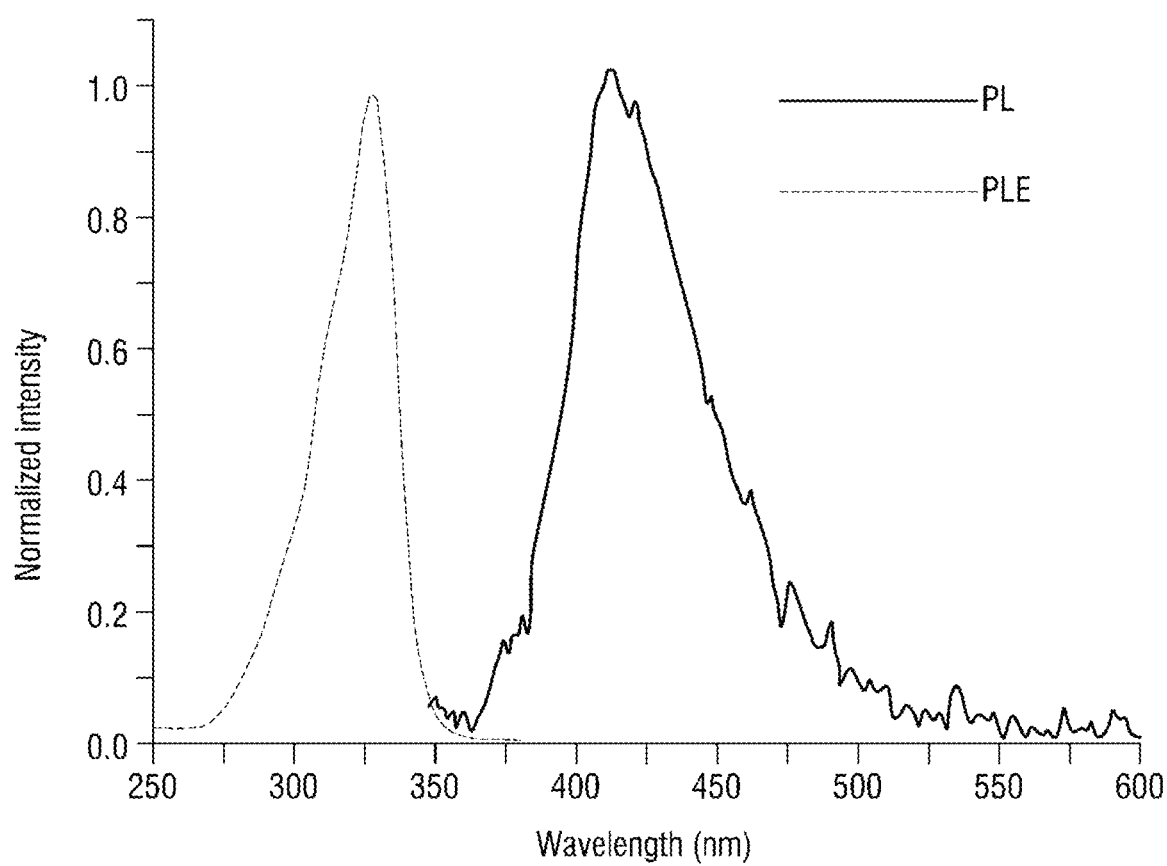
FIG. 17 is a graph showing the results of evaluating optical characteristics of $Cs_3Sb_2Br_9$ according to Preparation Example.

Optical characteristics of $Cs_3Sb_2Br_9$ were measured using the photocurable composite resin including the prepared $Cs_3Sb_2Br_9$, and the results thereof are shown in FIG. 17.

FIG. 17 is a graph showing the results of evaluating optical characteristics of $Cs_3Sb_2Br_9$ according to Preparation Example.

Referring to FIG. 17, it can be found that, in view of a photoluminescence excitation (PLE) spectrum, $Cs_3Sb_2Br_9$ can absorb light having a center wavelength band of about 330 nm. Further, it can be found that, in view of a photoluminescence (PL) spectrum, $Cs_3Sb_2Br_9$ can emit light having a center wavelength band of 440 nm or more. In some embodiments, it can be ascertained that the peak intensity of the PLE spectrum is similar to the peak density of the PL spectrum. Thus, it can be found that $Cs_3Sb_2Br_9$ can absorb high-energy light, for example, blue light and emit low-energy light, for example, green light, and in this case, the green light can be emitted with relatively high intensity. Therefore, $Cs_3Sb_2Br_9$ may have high light conversion efficiency in the color conversion element, and for example, may have high light conversion efficiency for green light.

As described above, according to the display device of an embodiment, luminance for light and light conversion efficiency can be improved by using a color conversion element including a perovskite compound.

The effects of embodiments of the present disclosure are not limited by the foregoing, and other various effects are within the scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments of the present disclosure have been disclosed for illustrative purposes, those skilled in the art will appreciate that various modifications, additions and substitutions are possible, without departing from the scope and spirit of the appended claims, and equivalents thereof.

What is claimed is:

1. A color conversion element, comprising:
a base substrate in which a first region and a second region are defined;
a color conversion layer on the base substrate, in the first region, and comprising color conversion particles configured to convert a wavelength of incident light;
a color light transmitting layer on the base substrate in the second region;
a color filter layer between the color conversion layer and the base substrate, on which light emitted from the color conversion layer is incident, and which is configured to block a part of the light;
a first capping layer and a second capping layer disposed between the color filter layer and the color conversion layer;
a first low refractive layer disposed between the first capping layer and the second capping layer;
a third capping layer and a fourth capping layer disposed on the color conversion layer; and
a second low refractive layer disposed between the third capping layer and the fourth capping layer;
wherein each of the color conversion particles comprises a compound represented by Formula 1:

$$A_m B_n X_l \qquad (1)$$

in Formula 1, A is Cs, Rb, or an alloy thereof; B is at least one selected from the group consisting of Cu, Sb, Ge, Sn, Bi, and an alloy thereof; m, n, and l are each an integer of 1 to 9; and X is at least one selected from the group consisting of F, Cl, Br, I, and a mixture thereof,
wherein the compound is free of Pb,
the first, second, third and fourth capping layer include inorganic insulating material, and
the first and second low refractive layer include organic insulating material.

2. The color conversion element of claim 1,
wherein each of the color conversion particles has a polygonal or linear structure.

3. The color conversion element of claim 2,
wherein a length of the color conversion particle measured in a first direction is longer than a length of the color conversion particle measured in a second direction perpendicular to the first direction, and the length of the color conversion particle measured in the second direction perpendicular to the first direction is greater than a thickness of the color conversion particle.

4. The color conversion element of claim 3,
wherein the length of the color conversion particle measured in the first direction is in a range of 2 nm to 300 nm, and the thickness of the color conversion particle is in a range of 0.5 nm to 5 nm.

5. The color conversion element of claim 1,
wherein the color conversion layer comprises a light transmitting resin that does not absorb the incident light.

6. The color conversion element of claim 5,
wherein the color conversion particles are dispersed in the light transmitting resin in a state where at least one particle is aggregated with another particle adjacent thereto.

7. The color conversion element of claim 5,
wherein the low refractive layer has a lower refractive index than the light transmitting resin of the color conversion layer.

8. The color conversion element of claim 1, wherein the color conversion layer comprises a first color conversion layer comprising first color conversion particles on which a first light having a center wavelength band of a first wavelength is incident and which convert the first light into a second light having a center wavelength band of a second wavelength longer than the first wavelength.

9. The color conversion element of claim 8,
wherein the color filter layer comprises a first color filter layer between the first color conversion layer and the base substrate, and the first color filter layer is configured to transmit the second light and to block the first light.

10. The color conversion element of claim 9,
wherein the color conversion layer further comprises a second color conversion layer comprising second color conversion particles configured to convert the first light into third light having a center wavelength band of a third wavelength longer than the second wavelength, and
the color filter layer further comprises a second color filter layer between the second color conversion layer and the base substrate.

11. The color conversion element of claim 10,
wherein, in Formula 1, the Xs of the first color conversion particles and the second conversion particles are different from each other.

12. The color conversion element of claim 10,
wherein the second color filter layer is configured to transmit the third light and to block the first light and the second light.

13. The color conversion element of claim 10,
wherein the second color conversion layer further comprises a quantum dot material.

14. The color conversion element of claim 10,
wherein when the first light is emitted, the first light is incident on the color light transmitting layer, the color filter layer further comprises a third color filter layer between the color light transmitting layer and the base substrate, the color light transmitting layer configured to emit the first light to the third color filter layer, and the third color filter layer is configured to transmit the first light and to block the second light and the third light.

15. The color conversion element of claim 1, further comprising:
an optical filter layer on a surface other than an outer surface of the color conversion layer, contacting the base substrate, and configured to reflect light emitted from the color conversion layer.

16. The color conversion element of claim 15, wherein the optical filter layer is configured to transmit at least a part of light incident on the color conversion layer or emitted from the color conversion layer, and configured to reflect other parts of the light.

17. A display device comprising:
a display element; and
a color conversion element on the display element,
wherein the color conversion element comprises:
a base substrate in which a first region and a second region are defined;
a color conversion layer on the base substrate, in the first region, and comprising color conversion particles configured to convert a wavelength of incident light;
a color light transmitting layer on the base substrate and in the second region;
a color filter layer between the color conversion layer and the base substrate, on which light emitted from the color conversion layer is incident, and which is configured to block a part of the light;
a first capping layer and a second capping layer disposed between the color filter layer and the color conversion layer;
a first low refractive layer disposed between the first capping layer and the second capping layer;
a third capping layer and a fourth capping layer disposed on the color conversion layer; and
a second low refractive layer disposed between the third capping layer and the fourth capping layer;
wherein each of the color conversion particles comprises a compound represented by Formula 1:

$$A_m B_n X_l \quad (1)$$

in Formula 1, A is Cs, Rb, or an alloy thereof; B is at least one selected from the group consisting of Cu, Sb, Ge, Sn, Bi, and an alloy thereof; m, n, and l are each an integer of 1 to 9; and X is at least one selected from the group consisting of F, Cl, Br, I, and a mixture thereof,
wherein the compound is free of Pb,
the first, second, third and fourth capping layer include inorganic insulating material, and
the first and second low refractive layer include organic insulating material.

18. The display device of claim 17, wherein each of the color conversion particles has a polygonal or linear structure.

19. The display device of claim 18, wherein a length of the color conversion particle measured in a first direction is longer than a length of the color conversion particle measured in a second direction perpendicular to the first direction, and the length of the color conversion particle measured in the second direction perpendicular to the first direction is greater than a thickness of the color conversion particle.

20. The display device of claim 19, wherein the length of the color conversion particle measured in the first direction is in a range of 2 nm to 300 nm, and the thickness of the color conversion particle is in a range of 0.5 nm to 5 nm.

21. The display device of claim 17, wherein the color conversion layer includes a light transmitting resin configured not to absorb the incident light.

22. The display device of claim 21, wherein the color conversion particles are dispersed in the light transmitting resin in a state where at least one particle is aggregated with another particle adjacent thereto.

23. The display device of claim 17, wherein the color conversion layer comprises:
a first color conversion layer comprising first color conversion particles on which first light having a center wavelength band of a first wavelength is to be incident and which are configured to convert the first light into second light having a center wavelength band of a second wavelength longer than the first wavelength; and
a second color conversion layer including second color conversion particles configured to convert the first light into third light having a center wavelength band of a third wavelength longer than the second wavelength.

24. The display device of claim 23, wherein, in Formula 1, the Xs of the first color conversion particles and the second conversion particles are different from each other.

25. The display device of claim 17, wherein the display element comprises:
a first substrate;
a second substrate facing the first substrate;
a liquid crystal layer between the first substrate and the second substrate; and
a light source located opposite to the light conversion element with respect to the liquid crystal layer.

26. The display device of claim 17, wherein the display element comprises:
a first electrode;
a hole transporting layer on the first electrode;
a light emitting layer on the hole transporting layer; and
a second electrode on the light emitting layer.

* * * * *